(12) United States Patent
Demarest

(10) Patent No.: US 9,146,093 B2
(45) Date of Patent: Sep. 29, 2015

(54) NON-HARMONIC CYCLIC ERROR COMPENSATION IN INTERFEROMETRIC ENCODER SYSTEMS

(71) Applicant: Zygo Corporation, Middlefield, CT (US)

(72) Inventor: Frank C. Demarest, Higganum, CT (US)

(73) Assignee: Zygo Corporation, Middlefield, CT (US)

( * ) Notice: Subject to any disclaimer, the term of this patent is extended or adjusted under 35 U.S.C. 154(b) by 377 days.

(21) Appl. No.: 13/672,021

(22) Filed: Nov. 8, 2012

(65) Prior Publication Data

US 2013/0278914 A1    Oct. 24, 2013

Related U.S. Application Data

(60) Provisional application No. 61/636,072, filed on Apr. 20, 2012.

(51) Int. Cl.
*G01B 11/02*       (2006.01)
*G01B 11/14*       (2006.01)
*G03B 27/32*       (2006.01)
(Continued)

(52) U.S. Cl.
CPC ............ *G01B 11/14* (2013.01); *G01B 9/02059* (2013.01); *G01D 5/38* (2013.01); *G03B 27/58* (2013.01); *G03F 7/70775* (2013.01);
(Continued)

(58) Field of Classification Search
CPC .............. G01B 9/02059; G01B 11/14; G01D 5/24476; G01D 5/34746; G01D 5/38; G03B 27/58; G03F 7/70725; G03F 7/70775; G03F 9/70; G03F 9/7049; G03F 9/7092; H01L 21/68–21/682

USPC ............ 310/12.05, 12.06, 12.19; 355/72, 75, 355/77; 356/399–401, 498–500, 614–616
See application file for complete search history.

(56) References Cited

U.S. PATENT DOCUMENTS 4,436,424 A    3/1984   Bunkenburg
4,629,886 A    12/1986  Akiyama et al.
(Continued)

FOREIGN PATENT DOCUMENTS

JP    2009-33166    2/2009
TW    201037267    10/2010

OTHER PUBLICATIONS

International Preliminary Report on Patentability and Written Opinion of the International Searching Authority for International Application No. PCT/US2012/064038 dated Oct. 30, 2014.
(Continued)

*Primary Examiner* — Colin Kreutzer
(74) *Attorney, Agent, or Firm* — Fish & Richardson P.C.

(57) ABSTRACT

A method includes obtaining, from a detector of an interferometry system, an interference signal based on a combination of a first beam and a reference beam, subsequent to the first beam being diffracted by an encoder scale, obtaining, through an electronic processor, an error compensation signal based on a non-harmonic cyclic error that modifies the interference signal, and outputting information about a change in a position of the encoder scale relative to an optical assembly of the interferometry system based on the interference signal and the error compensation signal.

32 Claims, 21 Drawing Sheets

(51) Int. Cl.

| | |
|---|---|
| *G03B 27/58* | (2006.01) |
| *G03B 27/62* | (2006.01) |
| *H02K 41/02* | (2006.01) |
| *H02K 41/03* | (2006.01) |
| *G03F 7/20* | (2006.01) |
| *H01L 21/68* | (2006.01) |
| *G03F 9/00* | (2006.01) |
| *G01B 9/02* | (2006.01) |
| *G01D 5/38* | (2006.01) |

(52) U.S. Cl.
CPC ............ *G03F9/7049* (2013.01); *G03F 9/7092* (2013.01); *H01L 21/681* (2013.01)

(56) References Cited

U.S. PATENT DOCUMENTS

| | | | |
|---|---|---|---|
| 4,676,645 A | 6/1987 | Taniguchi et al. | |
| 4,728,193 A | 3/1988 | Bartelt et al. | |
| 4,930,895 A | 6/1990 | Nishimura et al. | |
| 4,979,826 A | 12/1990 | Ishizuka et al. | |
| 5,035,507 A | 7/1991 | Nishioki et al. | |
| 5,430,546 A | 7/1995 | Huber | |
| 5,767,972 A | 6/1998 | Demarest | |
| 6,029,363 A | 2/2000 | Masreliez et al. | |
| 6,330,065 B1 | 12/2001 | Hill | |
| 6,407,815 B2 | 6/2002 | Akihiro | |
| 6,597,459 B2 | 7/2003 | Demarest | |
| 6,897,961 B2 | 5/2005 | Muenter et al. | |
| 6,922,249 B1 | 7/2005 | Ames et al. | |
| 6,950,192 B2 | 9/2005 | Hill | |
| 6,975,406 B2 | 12/2005 | Demarest | |
| 7,019,842 B2 | 3/2006 | Holzapfel et al. | |
| 7,109,900 B2 | 9/2006 | Kiriyama et al. | |
| 7,126,696 B2 | 10/2006 | Tobiason | |
| 7,154,609 B2 | 12/2006 | Holzapfel et al. | |
| 7,250,881 B2 | 7/2007 | Kiriyama et al. | |
| 7,426,037 B2 | 9/2008 | Ostrovsky et al. | |
| 7,428,685 B2 | 9/2008 | Demarest et al. | |
| 7,440,113 B2 | 10/2008 | Trutna, Jr. et al. | |
| 7,471,397 B2 | 12/2008 | Holzapfel | |
| 7,502,122 B2 | 3/2009 | Tobiason et al. | |
| 7,573,581 B2 | 8/2009 | Holzapfel | |
| 7,616,322 B2 | 11/2009 | Hill et al. | |
| 7,636,165 B2 | 12/2009 | Klaver et al. | |
| 7,812,964 B2 | 10/2010 | Hill | |
| 8,300,233 B2 | 10/2012 | Deck et al. | |
| 2008/0304077 A1 | 12/2008 | Demarest | |
| 2009/0268210 A1 | 10/2009 | Prince | |
| 2010/0128276 A1 | 5/2010 | de Groot et al. | |
| 2011/0255096 A1 | 10/2011 | Deck et al. | |
| 2012/0032067 A1 | 2/2012 | Goodwin et al. | |
| 2012/0154780 A1 | 6/2012 | Demarest | |
| 2012/0170048 A1 | 7/2012 | Deck et al. | |
| 2012/0212726 A1 | 8/2012 | Shibazaki et al. | |

OTHER PUBLICATIONS

M. Neviere et. al., "High accuracy translation rotation encoder with two gratings in a Littrow mount," Appl. Opt. 38(1): 67-76 (1999).

J. Partanen, "Multipass grating interferometer applied to line narrowing in excimer lasers," Appl. Opt., 25(21):3810-3815 (1986).

Bedrosian, E. "The Analytic Signal Representation of Modulated Waveforms," *Proc. of the IRE* (1962): 2071-2076.

Giacoletto, L. J. "Generalized Theory of Multitone Amplitude and Frequency Modulation;" *Proc of the IRE* (1947): 680-693.

Painter, J. H. "Synthesis Techniques for a Class of SSB-AM-PM Signals;" *IEEE Transactions on Aerospace and Electronic Systems* 5.3 (1969): 450-456.

Reilly, A., et al. "Analytic Signal Generation—Tips and Traps;" *IEEE Transactions on Signal Processing* 42.11 (1994): 3241-3245.

Schwartz, M. *Information Transmission, Modulation, and Noise.* Third Edition; McGraw Hill, 1980. 263-278.

International Search Report and Written Opinion mailed on Mar. 19, 2013 in counterpart International Application No. PCT/US2012/064038.

Taiwan Office Action for Taiwan Application No. 101141248 dated Jul. 8, 2015 (3 pages).

NON-HARMONIC CYCLIC ERROR COMPENSATION IN INTERFEROMETRIC ENCODER SYSTEMS

CROSS-REFERENCE TO RELATED APPLICATIONS

This application claims priority to Provisional Application No. 61/636,072, filed on Apr. 20, 2012, the contents of which are hereby incorporated by reference in their entirety.

BACKGROUND

Interferometric measuring systems can be used to monitor changes in the relative position of a measurement object based on an optical interference signal. For example, an interferometer generates the optical interference signal by overlapping and interfering a "measurement beam" that interacts with (e.g., reflects from) from the measurement object with a second beam, sometimes called a "reference beam" that does not interact with the measurement object. Changes in the relative position of the measurement object correspond to changes in the phase of the measured optical interference signal.

However, many interferometric measuring systems include nonlinearities such as what are known as "cyclic errors." The cyclic errors can be expressed as contributions to the phase and/or the intensity of the measured interference signal and have a sinusoidal dependence on the change in an optical path difference between the measurement beam and the second beam. The cyclic errors can be produced as a result of "beam mixing" (where a portion of an input beam that nominally forms the reference beam propagates along a measurement path and/or vice versa) and imperfections in interferometer components (e.g., retro-reflectors and phase retardation plates). In some cases, non-harmonic cyclic errors ("Ce Nh") are produced when a portion of the measurement beam and/or reference beam makes one or more passes through a partial measurement beam path. These cyclic errors have a frequency shift (i.e., the "Doppler" frequency) that is a non-integer multiple of the frequency difference between the components of the original input beam.

Another type of cyclic error includes the axis-dependent cyclic error ("CE Ad"). Axis-dependent cyclic errors may occur with changes in the relative position of the measurement object along multiple axes of motion. These cyclic errors have a cyclic error frequency ratio (i.e., ratio of cyclic error frequency shift to Doppler frequency) that is axis-dependent. For example, a different cyclic error frequency ratio may occur depending on whether the relative motion of the measurement object is along the X or Z direction. Both non-harmonic and axis-dependent cyclic errors can cause errors that are substantially larger in interferometric encoder systems compared to other types of interferometers. For example, a given cyclic error signal ratio can result in a larger position error (e.g., about three times as large) because the grating period of an encoder scale is generally coarser than the interference period of a comparable non-encoder based interferometer. Increased errors also can occur due to the reduced contrast (i.e., the ratio of time varying "AC" component of the interferometry signal relative to the background "DC" component of the interferometry signal) of interferometric encoder systems relative to other comparable interferometers.

In general, electronic compensation cannot correct for cyclic errors having non-harmonic or axis-dependent characteristics. Conventional methods of electronic compensation generate integer harmonics of the Doppler signal with simple trigonometric manipulations, and cannot compensate non-harmonic cyclic errors. Conventional methods of electronic compensation process signals from a single axis without consideration of other axes, and cannot compensate axis-dependent cyclic errors. Although filtering of CE Nh and CE Ad errors can be used in place of electronic compensation while the measurement object is in motion, filtering fails to correct for such errors during applications in which the speed of the relative motion is low, e.g., during alignment.

SUMMARY

The present disclosure relates to non-harmonic cyclic error compensation in interferometric encoder systems.

In a preferred embodiment, an interferometric encoder system is disclosed that includes control electronics configured to characterize non-harmonic cyclic errors, in which a cyclic error frequency shift is a non-integer multiple of a Doppler frequency, and/or axis-dependent cyclic errors, in which a ratio of a cyclic error frequency shift to the Doppler frequency depends on the axis of motion, and compensate an interference signal or signals for those errors.

Compensation of the interference signal(s) can include, for example, generating one or more complex prototype signals that represent the frequency or frequencies of non-harmonic cyclic errors, calculating coefficients that characterize the corresponding cyclic errors, generating compensation signals substantially similar to the cyclic errors, and compensating a complex representation of the interference signal(s) using the compensation signals. Compensation can further include, for example, reducing a magnitude of sideband frequencies that appear when generating a complex prototype signal representative of a non-harmonic cyclic error. Alternatively, or in addition, compensation can include, for example, generating a complex prototype signal that represents the frequency or frequencies of axis-dependent cyclic errors, and compensating a complex representation of the interference signal based on the complex prototype signal representative of the axis-dependent error(s). Such compensation also can include, for example, reducing a magnitude of one or more sideband frequencies associated with the complex prototype signal representative of the axis-dependent error(s). In some implementations, the compensation procedure includes storing one or more previously calculated compensation coefficients when a relative speed of an encoder scale (or interferometer) is below a specified threshold or when the relative speed of an encoder scale (or interferometer) renders it impractical to calculate a proper coefficient.

In some implementations, compensation of the interference signal also can include compensation of baseband Doppler, negative Doppler, and zero-Doppler cyclic errors. In some implementations, compensation can also include adjusting a cyclic error frequency ratio of non-integer compensation.

More generally, an innovative aspect of the subject matter described in this specification can be embodied in methods that include the actions of: obtaining, from a detector of an interferometry system, an interference signal based on a combination of a first beam and a reference beam, subsequent to the first beam being diffracted from an encoder scale; obtaining, through an electronic processor, an error compensation signal based on a non-harmonic cyclic error that modifies the interference signal; and outputting information about a change in a position of the encoder scale relative to an optical assembly of the interferometry system based on the interference signal and the error compensation signal.

Other embodiments of this aspect include corresponding computer systems, apparatus, and computer program products encoded on computer-readable media, each operable to cause a data processing apparatus to perform the actions of the methods. A system of one or more computers can be configured to perform particular operations or actions by virtue of having software, firmware, hardware, or a combination of them installed on the system that in operation causes the system to perform the actions. One or more computer program products can be configured to perform particular operations or actions by virtue of including instructions that, when executed by data processing apparatus, cause the apparatus to perform the actions.

The foregoing and other embodiments can each optionally include one or more of the following features, alone or in combination. For example, the non-harmonic cyclic error can cause a frequency shift in the interference signal equal to a non-integer multiple of a Doppler frequency.

In some implementations, the actions can further include providing an input beam, and deriving the first beam from the input beam, in which the Doppler frequency corresponds to a shift in frequency difference between the first beam and the reference beam caused by motion of the encoder scale.

In some implementations, the actions can further include applying a frequency transform to the interference signal to generate a transformed measurement signal in complex space, and modifying the transformed measurement signal based on the error compensation signal to obtain a compensated measurement signal having an attenuated non-harmonic cyclic error, in which the error compensation signal is a signal in complex space. Modifying the transformed measurement signal can include deducting (e.g., adding or subtracting) the error compensation signal from the transformed measurement signal.

Obtaining the error compensation signal can include, for example, compensating the transformed measurement signal based on at least one of a negative Doppler shift error, a baseband Doppler shift error, or a zero Doppler shift error to provide a partially compensated measurement signal. Obtaining the error compensation signal can include, for example, calculating a complex prototype signal based on the partially compensated measurement signal, in which the complex prototype signal represents a frequency of the non-harmonic cyclic error signal associated with the interference signal. In some implementations, obtaining the error compensation signal can include delaying the partially compensated measurement signal, obtaining a conjugate of the partially compensated measurement signal, and multiplying the complex prototype signal and the conjugate of the partially compensated measurement signal to obtain an output signal, in which the output signal corresponds to a frequency difference between the partially compensated measurement signal and the complex prototype signal. Obtaining the error compensation signal can include, for example, passing the output signal through a lowpass filter to obtain a non-harmonic cyclic error coefficient term, in which the non-harmonic cyclic error coefficient term includes a complex factor relating to an amplitude and an offset phase of the non-harmonic cyclic error, multiplying a conjugate of the of the non-harmonic cyclic error coefficient term with the complex prototype signal to obtain a non-harmonic correction signal, and adding the non-harmonic cyclic error correction signal to one or more other correction signals to provide the cyclic error compensation signal. In some implementations, the actions can further include storing the non-harmonic cyclic error coefficient term in a register.

In some implementations, calculating the complex prototype signal can include calculating a time-varying phase of the non-harmonic cyclic error, calculating an initial complex prototype signal based on the time-varying phase of the non-harmonic cyclic error, in which the initial complex prototype signal is representative of the frequency of the non-harmonic cyclic error signal, calculating a magnitude compensation signal based on a magnitude of the partially compensated measurement signal, calculating a partially attenuated prototype signal by multiplying the magnitude compensation signal and the initial complex prototype signal, and selectively attenuating the partially attenuated prototype signal to obtain the complex prototype signal.

In some implementations, the time-varying phase of the non-harmonic cyclic error can be based on a ratio of a non-harmonic cyclic error frequency shift to a Doppler frequency. In some implementations, the actions further can include adjusting the ratio based at least in part on one or more non-harmonic cyclic error compensation coefficients.

In some implementations, calculating the partially attenuated prototype signal includes attenuating a signal component of the initial prototype signal at a frequency equal to the Doppler frequency. In some implementations, selectively attenuating the partially attenuated prototype signal includes attenuating a signal component of the partially attenuated prototype signal at a frequency defined by a difference between the Doppler frequency and the frequency of the non-harmonic cyclic error signal. Selectively attenuating the partially attenuated prototype signal can further include, for example, calculating one or more sideband compensation signals, and deducting the one or more sideband compensation signals from the partially attenuated prototype signal. Calculating the one or more sideband compensation signals can, for example, be based on a non-harmonic cyclic error coefficient term. In some implementations, the actions can further include storing the non-harmonic cyclic error coefficient term in a register. The non-harmonic cyclic error coefficient term can be stored, for example, when a difference between the Doppler frequency and a non-harmonic error frequency is below a specified threshold. In some implementations, the actions can further include storing the non-harmonic cyclic error coefficient term when a speed of the encoder scale relative to the optical assembly along a first direction is below a specified threshold.

In some implementations, the actions can further include calculating at least one of a position of the encoder scale along a first direction or a motion of the encoder scale along the first direction based on the compensated measurement signal.

In some implementations, the first beam is twice diffracted from the encoder scale. The first beam and the second beam can be derived from a common source. The encoder scale can include a grating. The grating can include, for example, a one-dimensional grating or a two-dimensional grating.

Another innovative aspect of the subject matter described in this specification can be embodied in methods that include the actions of: obtaining a first interference signal based on interference of a first measurement beam with a reference beam, subsequent to the first measurement beam being diffracted by an encoder scale, the first interference signal being in complex space; obtaining a second interference signal based on interference of a second measurement beam with the reference beam, subsequent to the second measurement beam being diffracted by the encoder scale, the second interference signal being in complex space, in which each of the first interference signal and the second interference signal is associated with a first cyclic error shift in frequency based on motion of the encoder scale along a first direction parallel to the encoder scale, and with a second cyclic error shift in frequency based on motion of the encoder scale along a second different direction perpendicular to the first direction; obtaining, through an electronic processor, a first error compensation signal and a second error compensation signal; and outputting information about a change in a position of the encoder scale relative to an optical assembly based on at least a first combination of the first error compensation signal with the first interference signal or a second combination of the second error compensation signal with the second interference signal.

Other embodiments of this aspect include corresponding computer systems, apparatus, and computer program products encoded on computer-readable media, each operable to cause a data processing apparatus to perform the actions of the methods. A system of one or more computers can be configured to perform particular operations or actions by virtue of having software, firmware, hardware, or a combination of them installed on the system that in operation causes the system to perform the actions. One or more computer program products can be configured to perform particular operations or actions by virtue of including instructions that, when executed by data processing apparatus, cause the apparatus to perform the actions.

The foregoing and other embodiments can each optionally include one or more of the following features, alone or in combination. For example, a first ratio of the first cyclic error frequency shift to a first Doppler shift caused by motion in a first direction can be different from a second ratio of the second cyclic error frequency shift to a second Doppler shift caused by motion in a second direction.

The actions can further include, for example, providing an input beam, and deriving the first measurement beam and the second measurement beam from the input beam. The first ratio can be, for example, an integer number and the second ratio can be a non-integer number. In some implementations, obtaining the first error compensation signal and the second error compensation signal can include compensating the first interference signal and the second interference signal based on at least one of a negative Doppler shift error, a baseband Doppler shift error, or a zero Doppler shift error to obtain a first partially compensated measurement signal and a second partially compensated measurement signal, respectively.

In some implementations, obtaining the first error compensation signal and the second error compensation signal further can include calculating a first complex prototype signal and a second complex prototype signal, respectively, in which the first complex prototype signal represents a frequency of a first non-harmonic cyclic error associated with the first interference signal, and the second complex prototype signal represents a frequency of a second non-harmonic cyclic error associated with the second interference signal.

In some implementations, obtaining the first error compensation signal and the second error compensation signal further can include delaying each of the first partially compensated measurement signal and the second partially compensated measurement signal, obtaining a first conjugate of the first partially compensated measurement signal and a second conjugate of the second partially compensated measurement signal, and multiplying the first complex prototype signal by the first conjugate to obtain a first output signal, and the second complex prototype signal by the second conjugate to obtain a second output signal, in which the first output signal corresponds to a frequency difference between the first partially compensated measurement signal and the first complex prototype signal, and the second output signal corresponds to a frequency difference between the second partially compensated measurement signal and the second complex prototype signal.

In some implementations, obtaining the first error compensation signal and the second error compensation signal further can include passing each of the first output signal and the second output signal through corresponding lowpass filters to obtain a first non-harmonic cyclic error coefficient term and a second non-harmonic cyclic error coefficient term, respectively, in which the first non-harmonic cyclic error coefficient term includes a complex factor relating to an amplitude and an offset phase of the non-harmonic cyclic error associated with the first interference signal, and the second non-harmonic cyclic error coefficient term includes a complex factor relating to an amplitude and offset phase of the non-harmonic cyclic error associated with the second interference signal, multiplying a conjugate of the first non-harmonic cyclic error coefficient term with the first complex prototype signal to obtain a first non-harmonic correction signal, and multiplying a conjugate of the second non-harmonic cyclic error coefficient term with the second complex prototype signal to obtain a second non-harmonic correction signal, and adding one or more other correction signals to each of the first non-harmonic cyclic error correction signal and the second non-harmonic cyclic error correction signal to provide the first cyclic error compensation signal and the second cyclic error compensation signal, respectively.

The actions can further include, for example, storing the first non-harmonic cyclic error coefficient term and the second non-harmonic cyclic error coefficient term in one or more registers when a speed of the encoder scale relative to the optical assembly along a first direction is below a specified threshold.

In some implementations, calculating the first complex prototype signal and the second complex prototype signal can include calculating a first time-varying phase associated with the first non-harmonic cyclic error and a second time-varying phase associated with the second non-harmonic cyclic error, calculating a first initial complex prototype signal and a second initial complex prototype signal based on the first time-varying phase and the second time-varying phase, respectively, in which the first initial complex prototype signal is representative of a non-harmonic error signal frequency associated with the first interference signal, and the second initial complex prototype signal is representative of a non-harmonic signal frequency associated with the second interference signal, calculating a first magnitude compensation signal and a second magnitude compensation signal based on the first partially compensated measurement signal and the second partially compensated measurement signal, calculating a first partially attenuated prototype signal by multiplying the first magnitude compensation signal and the first initial complex prototype signal, calculating a second partially attenuated prototype signal by multiplying the second magnitude compensation signal and the second initial complex prototype signal, and selectively attenuating the first partially attenuated prototype signal and the second partially attenuated prototype signal.

In some implementations, selectively attenuating the first partially attenuated prototype signal includes attenuating two or more first signal components of the first partially attenuated prototype signal, and selectively attenuating the second partially attenuated prototype signal includes attenuating two or more second signal components of the second partially attenuated prototype signal.

In some implementations, calculating the first partially attenuated prototype signal includes attenuating two or more first signal components of the first initial complex prototype signal, at least one of the first signal components occurring at a frequency equal to a first Doppler frequency, and calculating the second partially attenuated prototype signal includes attenuating two or more second signal components of the second initial complex prototype signal, at least one of the second signal components occurring at a frequency equal to a second Doppler frequency. The first Doppler frequency can represent a shift in a frequency difference between the first measurement beam and the reference beam, and the second Doppler frequency can represent a shift in a frequency difference between the second measurement beam and the reference beam.

In some implementations, selectively attenuating the first partially attenuated prototype signal and the second partially attenuated prototype signal includes calculating one or more first sideband compensation signals, deducting the one or more first sideband compensation signals from the first partially attenuated prototype signal, calculating one or more second sideband compensation signals, and deducting the one or more second sideband compensation signals from the second partially attenuated prototype signal.

In some implementations, calculating the one or more first sideband compensation signals is based in part on a first non-harmonic cyclic error coefficient term, and calculating the one or more second sideband compensation signals is based in part on a second non-harmonic cyclic error coefficient term.

In some implementations, each of the time-varying phases of the first and second non-harmonic cyclic errors is based at least in part on a time-varying phase of the first interference signal, a time-varying phase of the second interference signal, a first ratio of a non-harmonic cyclic error frequency shift to a Doppler frequency based on motion of the encoder scale along a first direction parallel to the encoder scale, and a second ratio of a non-harmonic cyclic error frequency shift to a Doppler frequency based on motion of the encoder scale along a second different direction orthogonal to the first direction.

In some implementations, the actions can further include adjusting the second ratio based at least in part on one or more non-harmonic cyclic error compensation coefficients.

In some implementations, the actions can further include modifying the first interference signal based on the first error compensation signal to obtain a first compensated measurement signal, modifying the second interference signal based on the second error compensation signal to obtain a second compensated measurement signal, and calculating, based on the first compensated measurement signal and the second compensated measurement signal, at least one of a position of the encoder scale or a motion of the encoder scale. Modifying the first interference signal can include, for example, deducting the first error compensation signal from the first interference signal, and modifying the second interference signal can include, for example, deducting the second error compensation signal from the second interference signal Obtaining the first interference signal can include, for example, obtaining, from a first detector of the interferometry system, a first detected signal, the first detected signal representing the interference of the first measurement beam with the reference beam, and applying a frequency transform to the first detected signal to generate the first interference signal in complex space, and obtaining the second interference signal can include obtaining, from a second detector of the interferometry system, a second detected signal representing the interference of the second measurement beam with the reference beam, and applying the frequency transform to the second detected signal to generate the second interference signal in complex space Another innovative aspect of the subject matter described in this specification can be embodied in an apparatus that includes: an interferometry system configured to, during operation of the apparatus, combine a measurement beam diffracted from an encoder scale and a reference beam to produce an output beam corresponding to an interference signal, in which at least one of the encoder scale and an optical assembly of the interferometry system is moveable with respect to the other; and an electronic processor. The electronic processor can be configured to, during operation of the apparatus, perform operations that include: obtaining the interference signal from a detector of the interferometry system; obtaining an error compensation signal based on a non-harmonic cyclic error that modifies the interference signal; and outputting information about a change in a position of the encoder scale relative to the optical assembly based on the interference signal and the error compensation signal.

Another innovative aspect of the subject matter described in this specification can be embodied in a lithography system that includes a moveable stage for supporting a wafer, in which the moveable stage includes an encoder scale that moves with the moveable stage, an illumination system configured to image radiation onto the wafer during operation of the lithography system, a positioning system configured to adjust a position of the moveable stage during operation of the lithography system, an interferometry system, and an electronic processor. The interferometry system is configured to, during operation of the lithography system, direct a measurement beam toward the encoder scale, combine the measurement beam and a reference beam, subsequent to the measurement beam being diffracted by the encoder scale, to produce an output beam corresponding to a first interference signal, and detect the interference signal at a detector. The electronic processor is configured to, during operation of the lithography system, perform operations that include obtaining the interference signal from the detector, obtaining an error compensation signal based on a non-harmonic cyclic error associated with the interference signal, and outputting information about a change in a position of the encoder scale relative to an optical assembly of the interferometry system based on the interference signal and the error compensation signal.

Particular implementations of the subject matter described in this specification can be implemented so as to realize one or more of the following advantages. For example, electronic compensation of the cyclic errors can enables the system to have a greater tolerance for optical, mechanical, or electronic imperfections. By improving tolerance for imperfections, lower costs and/or greater performance can be achieved. The implementations described herein are applicable with linear encoders and, in some implementations, displacement interferometers.

All publications, patent applications, patents, and other references mentioned herein are incorporated by reference in their entirety. In case of conflict, the present specification, including definitions, will control. In addition, the materials, methods, and examples are illustrative only and not intended to be limiting.

The details of one or more embodiments are set forth in the accompanying drawings and the description below. Other features, aspects, and advantages will be apparent from the description, the drawings, and the claims.

DETAILED DESCRIPTION

Figure 1:
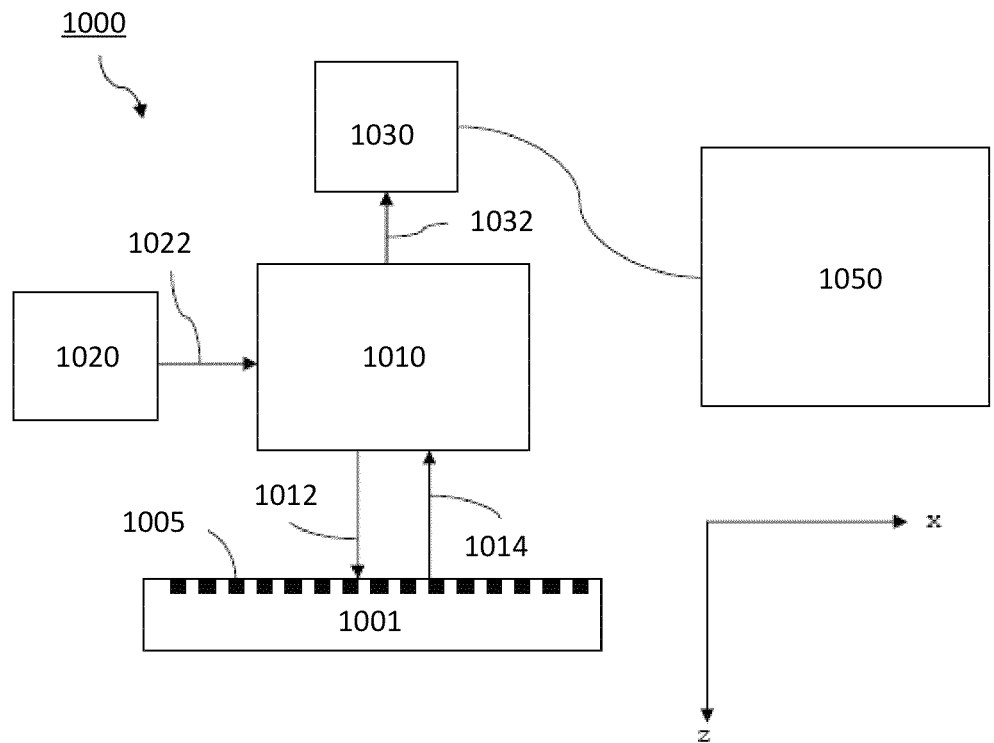
FIG. 1 is a schematic diagram of an example of an interferometric encoder system.

The present disclosure is directed towards cyclic error compensation in interferometric encoder systems. The disclosure below is organized into four sections. A first section of the disclosure, entitled "Interferometric Encoder Systems," relates to a general description of how an interferometric encoder may operate. A second section of the disclosure, entitled "Cyclic Error Sources," relates to several types of optical sources of cyclic errors. A third section, entitled "Cyclic Error Correction," relates to structures and methods for correcting non-harmonic and axis dependent cyclic errors in interferometric encoder systems. A fourth section of the disclosure entitled, "Lithography Systems," relates to structures and methods for employing the interferometric encoder system in a lithography system.

Interferometric Encoder Systems

An interferometric encoder system is a type of interferometric measurement system that is capable of evaluating the motion of a measuring graduation, generally referred to as an "encoder scale," in one or more displacement directions. During operation of an interferometric encoder system, an input illumination beam is separated into two beams, one beam of which is incident on, and diffracts from, a moveable encoder scale, and the other beam of which is recombined with the diffracted beam to produce an interferometry signal indicative of changes in the relative position of the encoder scale. In some implementations, both beams are incident on and diffract from the moveable encoder scale.

In some embodiments, the two beams have orthogonal polarizations so that polarization-sensitive optics can be used to separate them from the input illumination beam, direct them along their respective paths, and recombine them.

Furthermore, in some embodiments, the two beams have a small difference in frequency (e.g., a difference in the kHz to MHz range) to produce an interferometry signal of interest at a frequency generally corresponding to this frequency difference. This frequency is hereinafter referred to interchangeably as the "heterodyne" frequency or the "reference" frequency. The heterodyne frequency is denoted as $\omega_R$ (with respect to angular frequency). Information about the changes in the relative position of the encoder scale generally corresponds to a phase of the interferometry signal at this heterodyne frequency. Signal processing techniques can be used to extract this phase. In general, the moveable encoder scale causes this phase term to be time-varying. In this regard, the first order time derivative of the encoder scale movement causes the frequency of the interferometry signal to shift from the heterodyne frequency by an amount referred to herein as the "Doppler" shift or "Doppler" frequency.

In some embodiments of the interferometric encoder system, the input illumination beam provided the source has two orthogonally polarized components having a frequency difference equal to the heterodyne frequency.

Encoder scales typically include a structure that extends periodically along at least one dimension and can diffract an incident beam, such that the incident beam splits into multiple beams travelling in different directions. The directions of the beams depend on the spacing of the periodic structure and the wavelength of the incident beam. An example of a particular type of encoder scale is a grating, where the grating includes a periodic pattern (e.g., a binary pattern) repeating in one or more dimensions. Encoder scales are used extensively in lithographic applications due to their relative insensitivity to atmospheric turbulence, generally the primary error source of displacement measuring interferometers.

Referring now to FIG. 1, an interferometric encoder system 1000 includes a light source 1020, an optical assembly 1010, a target 1001, a detector system 1030 (e.g., including a polarizer and a detector), and an electronic processor 1050. A Cartesian coordinate system is shown for reference.

Target 1001 includes an encoder scale 1005, such as a grating, having grating lines that extend orthogonal to the plane of the page, parallel to the y-axis of the Cartesian coordinate system shown in FIG. 1. The grating lines are periodic along the x-axis. Encoder scale 1005 has a grating plane corresponding to the x-y plane. During operation, encoder system 1000 monitors one or more degrees of freedom of target 1001 with respect to optical assembly 1010, including a position of target 1001 with respect to the x-axis.

To perform the monitoring, source 1020 directs an input beam 1022 to optical assembly 1010. Optical assembly 1010 derives a primary beam 1012 from input beam 1022 and directs primary beam 1012 to target 1001. Encoder scale 1005 diffracts incident primary beam 1012 into one or more diffracted orders. At least one of these diffracted orders, e.g., diffracted beam 1014 (shown displaced for clarity) in FIG. 1, returns to optical assembly 1010, where it is combined with a second beam (not shown) to form an output beam 1032. The second beam also can be derived from input beam 1022. Each of the primary beam 1012 and the second beam can be derived from the input beam 1022 using one or more first optical components (not shown) of the optical assembly 1010. For example, the primary beam 1012 and second beam can be derived using a beamsplitter, which splits the input beam 1022 based on the polarization (which may correspond to heterodyne frequency) of the input beam 1022. Similarly, the diffracted beam 1014 and the second beam can be combined using one or more second optical components (not shown) of the optical assembly 1010. For example, the diffracted beam 1014 and the second beam can be combined using a polarizing beam combiner. In some implementations, the same optical component can be used to split the input beam 1022 into the primary beam 1012 and second beam, as well as combine the diffracted beam 1014 and the second beam.

In some embodiments, the diffracted beam 1014 is a non-zeroth order diffracted beam. The output beam 1032 includes phase information related to the optical path difference between the component corresponding to the primary beam and the component corresponding to the second beam. Optical assembly 1010 directs output beam 1032 to detector system 1030 that detects the output beam and sends a signal to control electronics including electronic processor 1050 in response thereto.

Electronic processor 1050 receives and processes the signal and determines information about one or more degrees of freedom of target 1001 relative to optical assembly 1010. Specifically, the electronic processor determines this information based on a heterodyne phase of the signal, which arises because of how the source, optical assembly, and detection system are configured. In particular, the encoder system is provided so that the primary and second beams have orthogonal polarizations and different (optical) frequencies (the difference of which defines a "heterodyne" frequency). The different (optical) frequencies can be produced, for example, by laser Zeeman splitting, by acousto-optical modulation, using two different laser modes, or internal to the laser using birefringent elements, among other techniques. The orthogonal polarizations allow a polarizing beam-splitter to direct the first and second beams along different paths, respectively, and combine the first and second beams to form the output beam that subsequently passes through a polarizer, which analyzes the components so they can interfere. In the absence of target motion the interference signal oscillates at the heterodyne frequency, which is just the difference in the optical frequencies of the two components. In the presence of motion the heterodyne frequency incurs a change related to the velocity of the target through well-known Doppler relations. Accordingly, monitoring changes in the heterodyne phase or frequency allows one to monitor motion of the target relative to the optical assembly.

In some embodiments, the primary beam is incident on encoder scale 1005 at an incident angle such that the diffracted beam does not satisfy the Littrow condition. The Littrow condition refers to an orientation of a grating with respect to an incident beam where the grating directs the diffracted beam back towards the source such that the diffracted beam is co-linear with the incident beam. For example, in encoder system 1000, the primary beam 1012 is co-linear with the diffracted beam 1014 at the grating.

The "input beam" refers to the beam emitted by the light source. Generally, the input beam includes a component corresponding to a first beam and a component corresponding to the second beam. In other words, the input beam contains a component at a first frequency and polarization and another component at a different frequency at the orthogonal polarization. The "primary beam" refers to the beam that is initially incident on the encoder scale. In some instances, the primary beam is the same as the input beam (e.g., where the input beam is directed directly from the source to the target without interacting with beamsplitters, for example). In some embodiments, the primary beam contains a component corresponding to the first beam and a component corresponding to the second beam (e.g., two orthogonally polarized components at different angular frequencies). In certain embodiments, the input beam is split into the primary beam and the second beam before the primary beam contacts the target, so that the primary beam only contains the polarization/frequency component of the first beam.

While encoder scale 1005 is depicted in FIG. 1 as a grating structure that is periodic in one direction, more generally, "encoder scales" refer to measuring graduations that include a structure that extends along at least one dimension and diffracts the primary beam. In some embodiments, encoder scales can have periodic structures extending in two directions (e.g., along the x- and y-axis). In general, the encoder scale and source are selected so that the encoder system provides a signal with sufficient strength and accuracy to monitor the degree of freedom of the target with a desired accuracy. In some embodiments, the source has a wavelength in a range from 400 nm to 1,500 nm. For example, the source can have a wavelength of about 633 nm or about 980 nm. In some embodiments, the source can be a HeNe laser. If a grating is used as the encoder scale, the grating can have a pitch in a range from about $1\lambda$ to about $20\lambda$, where $\lambda$ is a wavelength of the source. For example, the grating can have a pitch in a range from about 1 µm to about 10 µm.

Figure 2:
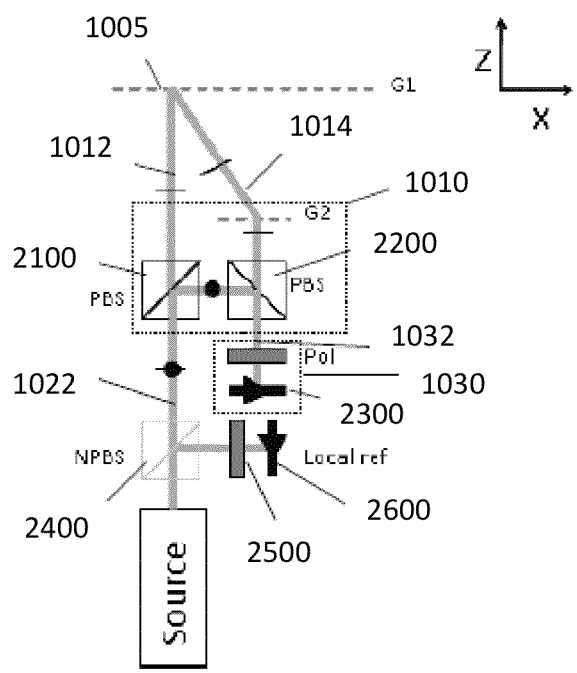
FIG. 2 is a schematic diagram of an example of another interferometric encoder system.

In some embodiments, a single interfered frequency component is influenced by the target encoder scale. For example, referring to FIG. 2, an optical assembly 1010 of an interferometric encoder system includes a first polarizing beam splitter (PBS) 2100, a second PBS 2200, a grating G2, and polarizer (labeled "pol"), and a detector 2300. PBS 2100 splits input beam 1022 into primary beam 1012 and the secondary beam. As shown, primary beam 1012 is polarized in the plane of the figure, while the secondary beam is polarized orthogonal to the plane of the figure. Primary beam 1012 is diffracted by encoder scale 1005 (grating G1), providing first diffracted beam 1014 which corresponds to a non-zeroth diffracted order (e.g., first order) of primary beam 1012. Grating G2 diffracts first diffracted beam 1014 so that it is incident on PBS 2200 along a path parallel to the path of primary beam 1012. PBS 2200 combines first diffracted beam 1014 with the second beam to form output beam 1032. At detector system 1030, the polarizer (pol) analyzes the first diffracted beam and second beam components of the output beam before the output beam is incident on detector 2300 where the two beams mix. Although FIG. 2 shows that primary beam 1012 is diffracted once by encoder scale 1005, interferometer system can be modified such that the primary beam 1012 is diffracted multiple times by encoder scale 1005. For example, in some embodiments, a retro-reflector can be employed to redirect the first diffracted beam back toward the encoder scale such that the first diffracted beam is diffracted a second time to produce a twice-diffracted beam. The twice-diffracted beam then can be combined with a reference beam to form the output beam.

Figure 3:
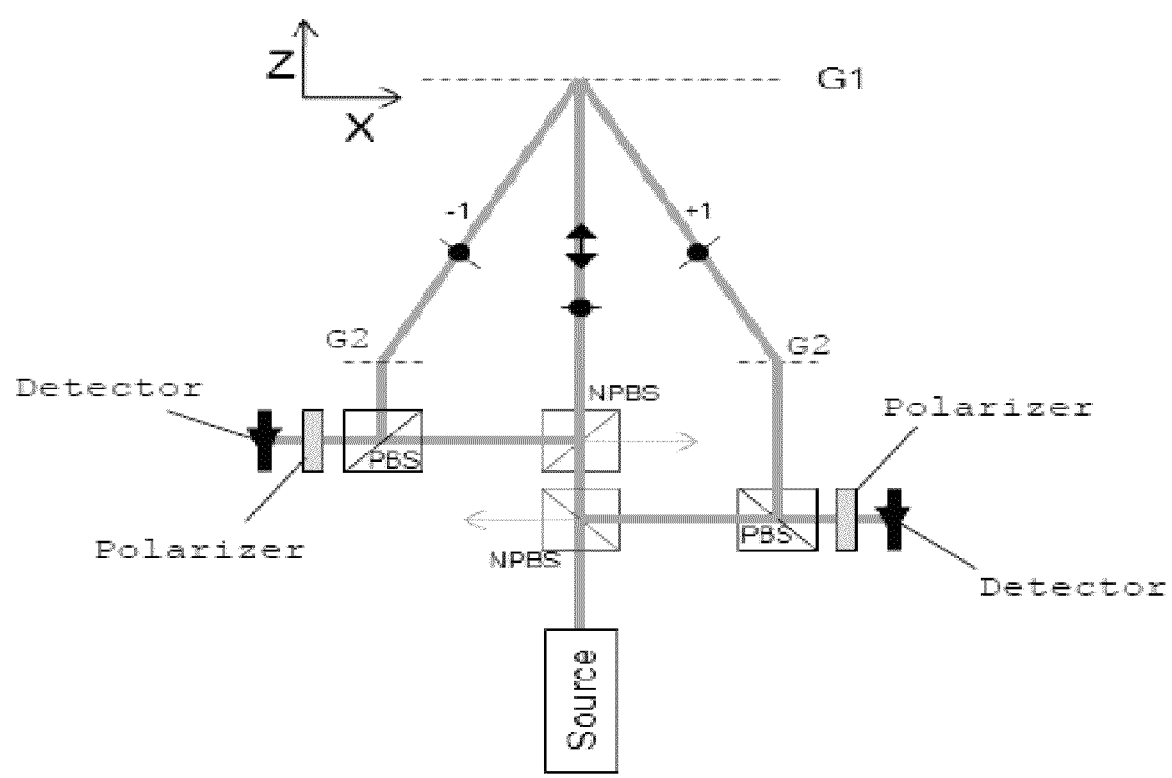
FIG. 3 is a schematic diagram of an example of another interferometric encoder system.

Further embodiments are contemplated that are based on the embodiments depicted in FIG. 2. For example, FIG. 3 shows a variant that incorporates two detection channels, each of which interfere either the +1 or −1 diffracted orders separately to both improve motion sensitivity resolution and distinguish between encoder scale motion along the primary beam axis (i.e., the Z-axis) and the encoder scale plane (i.e., the X-axis). Here, the second beam for each detection channel corresponds to the zeroth order diffraction of the primary beam, which is nominally normally incident on the encoder scale G1. Since encoder scale motion in the Z direction is common to both, while encoder scale motion along X is detected with opposite signs, the two motions can be distinguished by a composite signal consisting of the sum or difference of the two separate phases. For this case the basic equations for the change in phase as a function of motion along X($\Delta x$) and motion along Z($\Delta z$) for the two detectors are $$\varphi^+ = \frac{2\pi}{\Lambda}\Delta x + \frac{2\pi}{\lambda}(1+\cos(\theta))\Delta z \text{ and}$$

$$\varphi^- = -\frac{2\pi}{\Lambda}\Delta x + \frac{2\pi}{\lambda}(1+\cos(\theta))\Delta z$$

where the ± superscripts represent + or − order, $\lambda$ is the illumination wavelength, $\Lambda$ is the period of the encoder scale pattern (e.g., a grating period) and the $1^{st}$ order diffraction angle $\theta$ is found from the equation $\lambda = \Lambda \sin(\theta)$. To obtain the displacements one forms the sum and difference equations $$\Delta z = \frac{\varphi^+ + \varphi^-}{4\pi}\left(\frac{\lambda}{1+\cos(\theta)}\right) \text{ and}$$

$$\Delta x = \frac{\varphi^+ - \varphi^-}{4\pi}\Lambda.$$

For 2-dimensional (2D) applications using an area grating, the motion in the perpendicular (Y) axis can be obtained with another set of components rotated 90 degrees about Z from the first, for example, providing two additional detection channels that provide a displacement in the Y-direction, $\Delta y$.

Depending on the embodiment, an output signal S(t) from the detector(s) can be a single or quadrature, sinusoidal or quasi-sinusoidal output signal. In the case of quadrature signals, S(t) can include a complex signal having a real and imaginary part.

In further embodiments, the interferometry system may be different than that shown in FIG. 1. In particular, the cyclic error compensation techniques described below are applicable to other types of interferometers as well. For example, the output interference signal S(t) may be produced by an interferometry system that may include any of single and/or multiple pass interferometers, passive interferometers, dynamic interferometers, and dispersion interferometers. Furthermore, the interferometry system may monitor one or more degrees of freedom, each of which may produce a corresponding main interference signal S(t), which may be compensated for cyclic errors as disclosed herein. Furthermore, the degree(s) of freedom monitored by the interferometry system may include any of changes in distance to a measurement object, changes in relative distance between two measurement objects, changes in the angular orientation of a measurement object, and changes in the direction of the input beam.

Further embodiments of interferometric encoder systems can be found, for example, in U.S. Patent App. Publication No. 2012/0170048 and U.S. Pat. No. 8,300,233, each of which is incorporated herein by reference.

Cyclic Error Sources

Prior to describing embodiments of cyclic error correction, it is useful to discuss the sources and types of cyclic errors that occur in interferometric encoder systems. A "cyclic error" can be understood to mean an error in a measured interference signal that is periodic with the relative position of a measurement object and/or an optical assembly of an interferometry system. Cyclic errors include "harmonic cyclic errors" and "non-harmonic cyclic errors." A harmonic cyclic error can be understood to mean a cyclic error that causes a frequency shift in the interference signal equal to an integer multiple of the Doppler frequency, and a non-harmonic cyclic error can be understood to mean a cyclic error that causes a frequency shift in the interference signal equal to a non-integer multiple of the Doppler frequency.

In general, optical cyclic errors can be introduced into an interferometric encoder system through "beam mixing," in which spurious "ghost" beams interfere with other desired beams, such as a primary beam (e.g., a measurement beam) and/or a second beam (e.g., a reference beam), in the system. These ghost beams may have different amplitudes, different phase offsets, and/or different frequencies from the beams with which they combine, resulting in a shift in a detected interference signal frequency or phase, or a change in detected interference signal amplitude. Accordingly, measurements of the relative position of the encoder scale may deviate from the encoder scale's actual position, thus limiting the accuracy of displacement changes measured by the interferometer. Ghost beams can be caused by various imperfections in the interferometer system, such as leakage of undesired beams or unwanted reflections/diffraction from components of the interferometer system, such as the encoder scale. Interference of the desired beams and the ghost beams, whether from leakage or other imperfections in the interferometer system, can lead to various types of cyclic errors that cause deviations in the detected output beam. A more detailed discussion of possible sources of ghost beams can be found, for example, in U.S. Patent App. Pub. No. 2012/0154780, incorporated herein by reference.

Various different types of cyclic errors can be produced as a result of undesired beam mixing. For example, in some embodiments, a cyclic error may be classified as a zero Doppler shifted error ("CE 0"), in which one or more ghost beams interfere to give rise to an error that occurs at the heterodyne frequency difference between the components of the original input beam. A second type of cyclic error includes, for example, the negative Doppler shift error ("CE N"), where ghost beams interfere to give rise to a signal that is Doppler shifted in the opposite direction to the frequency shift of the desired output signal. A third type of cyclic error includes, for example, the baseband Doppler shift error ("CE B"). Baseband Doppler shifted errors arise when the ghost beam frequency is near and interferes with the Doppler shifted measurement signal frequency. Further information on the above types of cyclic errors can be found, for example, in U.S. Patent App. Pub. No. 2012/0154780, the contents of which are hereby incorporated by reference in their entirety.

With CE N and CE B errors, the frequency shift corresponds to an integer multiple of the Doppler frequency. As explained above, in some embodiments, the frequency shift of a cyclic error is a non-integer multiple of the Doppler frequency, referred to as "non-harmonic" cyclic errors ("CE Nh"). Non-harmonic cyclic errors can be produced when a portion of the primary beam has one or more passes through a portion of the measurement path that is changing due to motion of an optical assembly and/or encoder scale (not the entire measurement path as with certain other cyclic errors).

A category of cyclic error includes axis-dependent cyclic errors (CE Ad). Axis-dependent cyclic errors may be produced when the position of the target object relative to the optical assembly changes along multiple axes of motion. Axis-dependent cyclic errors have a cyclic error frequency ratio (the ratio of cyclic error frequency shift to the Doppler frequency) that is axis-dependent. For example, in some embodiments, an axis-dependent cyclic error can arise due to a multi-pass Littrow diffraction of an incident beam from the encoder scale, in which the cyclic error frequency ratio for motion along the X direction (e.g., a harmonic cyclic error ratio) differs from the cyclic error frequency ratio (e.g., non-harmonic cyclic error ratio) for motion along the Z direction.

Figure 4:
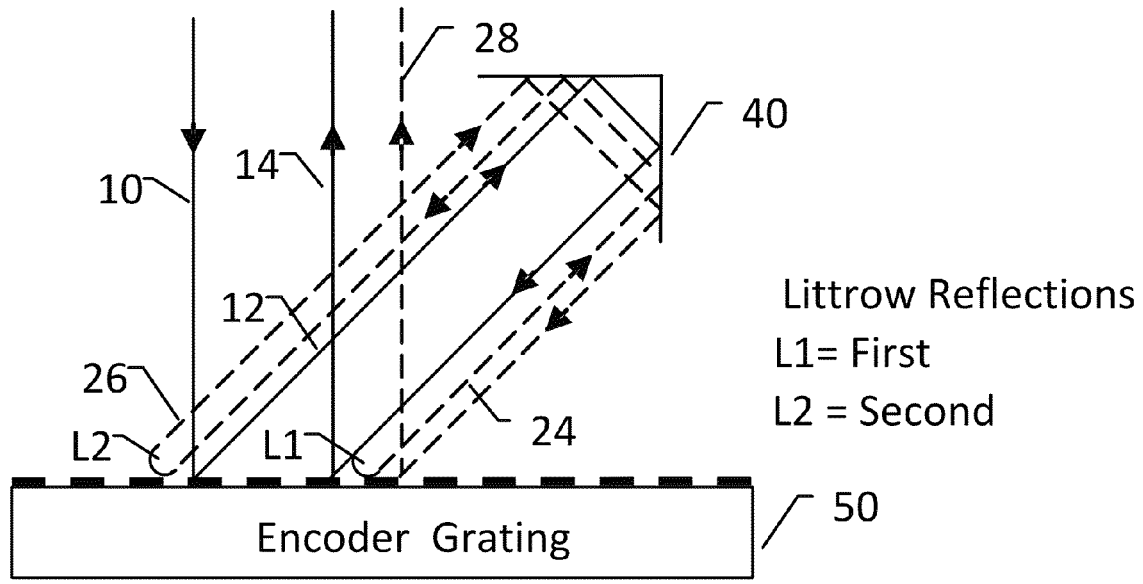
FIG. 4 is a schematic of an encoder scale configuration in which non-harmonic and axis-dependent cyclic errors occur.

FIG. 4 is a schematic that illustrates an example of a configuration in which non-harmonic and axis-dependent cyclic errors can occur. In particular, the configuration of FIG. 4 shows an example of when a portion of a beam incident on an encoder scale undergoes multi-pass Littrow diffraction. The desired measurement beams are shown by solid lines. The undesired beams (e.g., beams that cause a shift in a detected interference signal frequency, phase, or amplitude) are shown as dashed lines. In the example of FIG. 4, a primary beam 10 is incident on encoder scale 50, in which the scale 50 includes a grating. The primary beam 10 diffracts off grating 50 as first diffracted beam 12. First diffracted beam 12 is subsequently returned by corner reflector 40 to a nearby point on grating 50 and is diffracted a second time as measurement beam 14. The first diffracted beam 12 also undergoes a first Littrow diffraction L1, which produces beam 24 returning on the same optical path back through corner reflector 40. For clarity, beam 24 and first diffracted beam 12 are shown as displaced. Beam 24 then undergoes a second Littrow diffraction L2 which produces beam 26 returning along the same optical path back through corner reflector 40. Beam 26 then diffracts from the grating as beam 28, which is substantially coincident with and parallel to the desired measurement beam 14. Beam 28 produces a cyclic error when combined with measurement beam 14 and a reference beam (not shown) in the measurement electronics of the interferometer. In some implementations, non-Littrow angles of diffraction could also produce cyclic errors under appropriate geometric arrangement of the target object and optical components. In some implementations, for example, the interferometric encoder systems shown in FIG. 2 and FIG. 3 could have non-Littrow angles of diffraction that lead to non-harmonic and/or axis dependent errors. For example, in FIG. 2, an extra round-trip on the path from PBS 2100 to grating 1005 can, in certain implementations, lead to a ratio of cyclic error frequency shift to Doppler frequency that is a non-integer along the Z-direction.

Figure 5:
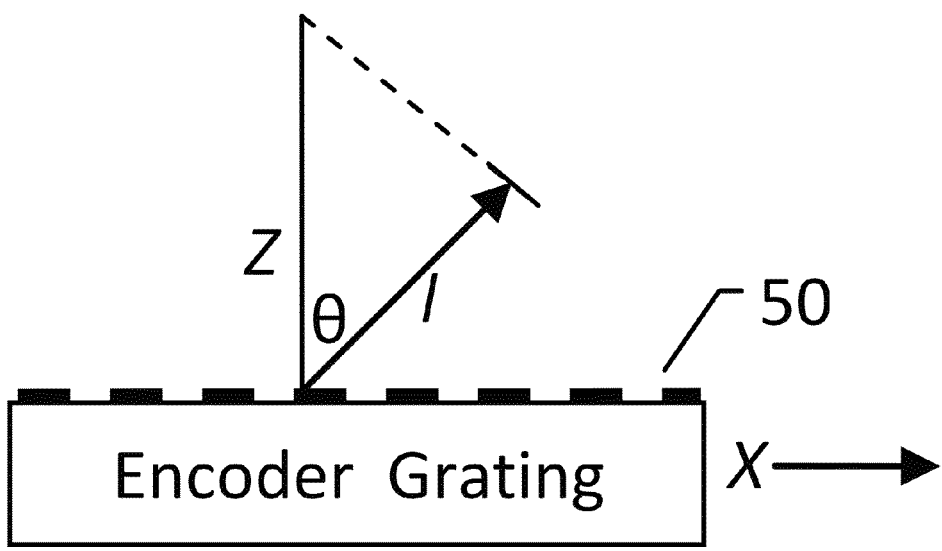
FIG. 5 is a schematic of an example of a geometric layout for calculating a change in position of an encoder scale.

FIG. 5 is a schematic of an example of a geometric layout for calculating a change in position of an encoder scale. The parameter Z represents the path distance traveled by the beam from the optical assembly to the encoder scale 50, the parameter l represents the path distance traveled by the beam upon diffraction from the encoder scale 50, and the parameter theta represents the angle at which the beam diffracts from the encoder scale 50.

To calculate the position measurement in both the X and Z direction, information from both a positive diffraction direction and a negative diffraction direction is analyzed. The positive diffraction information (e.g., the +1 diffracted order) can be obtained using a first channel and the negative diffraction information (e.g., the −1 diffracted order) can be obtained using a second channel.

Figure 6:
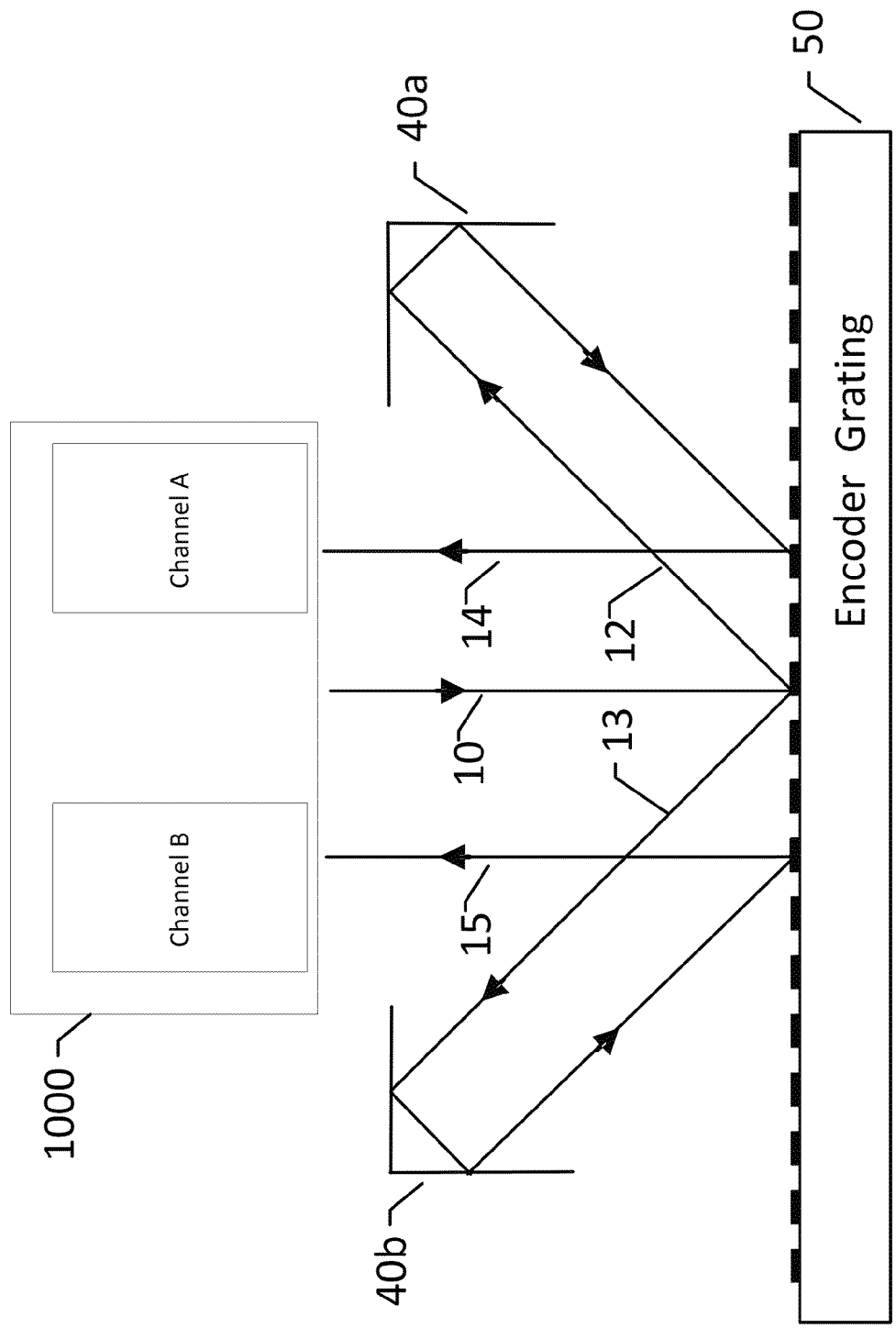
FIG. 6 is a schematic diagram of an example of an interferometric encoder system that includes two separate channels to determine changes in position of an encoder scale along different axes.

FIG. 6 is a schematic of an example of an interferometric encoder system in which two channels (channel A and channel B) are utilized to determine changes in position of an encoder scale 50 along multiple different axes. Channel A and channel B can be a part of the same interferometer system or separate interferometer systems. In an example, each of channel A and channel B can be a part of the interferometric encoder system 1000 shown in FIG. 1. Each channel can include a photodetector for detecting an output beam, as well as electronic processing hardware and appropriate software for determining a position of the target object based on the detected output beam. Axis-dependent cyclic error correction generally requires the processing of signals from two or more channels.

Similar to the arrangement shown in FIG. 4, a primary beam 10 in FIG. 6 is incident on an encoder scale 50. For ease of viewing, the portions of the beam undergoing Littrow diffraction are omitted from the figure. Diffracted beam 12 corresponds to the +1 diffracted order and propagates toward the first corner reflector 40a where the beam 12 is redirected toward encoder scale 50 and diffracted again back to channel A of the interferometer as beam 14. At channel A, the return beam 14 is combined with a reference beam to form a first output beam, which is detected by a first photodetector. Diffracted beam 13 corresponds to the −1 diffracted order, which propagates toward the second corner reflector 40b where the beam 13 is redirected toward encoder scale 50 and diffracted again back to channel B as beam 15. At channel B, the return beam 15 is combined with a reference beam to form a second output beam, which is detected by a second photodetector.

Based on FIGS. 5 and 6, a change in optical path length (OPL) in channel A, which includes the change in position of the encoder scale relative to the optical assembly, for embodiments in which the measurement beam makes two passes to the encoder scale, can be expressed as:

$$\Delta OPL_A = 2(\Delta Z + \Delta l + \Delta X \sin\theta) \quad (1)$$

Including the length of l changing due to changes in Z: $\Delta l = \Delta Z \cos\theta$, the equation becomes:

$$\Delta OPL_B = 2(\Delta Z(1+\cos\theta) + \Delta X \sin\theta) \quad (2)$$

Combining with the grating equation $$\frac{\lambda}{s} = \sin\theta$$

(where λ is the wavelength and s is the grating pitch), the identity $\cos\theta = \sqrt{1-\sin^2\theta}$ and the conversion from OPL to phase $$\varphi = \frac{2\pi}{\lambda} OPL$$

gives the change in phase in channel A, which can be expressed as:

$$\Delta\varphi_A = \frac{2\pi}{\lambda}\left[2\Delta Z\left(1 + \sqrt{1-\left(\frac{\lambda}{s}\right)^2}\right) + 2\Delta X\left(\frac{\lambda}{s}\right)\right] \quad (3)$$

Similarly, for the −1 diffracted order in channel B, the change in phase can be expressed as:

$$\Delta\varphi_B = \frac{2\pi}{\lambda}\left[2\Delta Z\left(1+\sqrt{1-\left(\frac{\lambda}{s}\right)^2}\right)-2\Delta X\left(\frac{\lambda}{s}\right)\right] \quad (4)$$

Subtracting the two terms and solving for $\Delta X$ yields:

$$\Delta X = \frac{s}{4\pi}\frac{\Delta\varphi_A - \Delta\varphi_B}{2} \quad (5)$$

Adding the two terms and solving for $\Delta Z$ yields:

$$\Delta Z = \frac{\lambda}{4\pi}\frac{1}{1+\sqrt{1-\left(\frac{\lambda}{s}\right)^2}}\frac{\Delta\varphi_A - \Delta\varphi_B}{2} \quad (6)$$

The cyclic error beam paths, $OPL_{Nh}$, are partial paths due to the Littrow diffraction from the encoder scale, producing integer cyclic error rations for X motion, and non-integer cyclic error ratios for Z motion ("CE Nh"). For example, referring to FIG. 4, harmonic cyclic error beams make an integer number of passes through the portion of the beam path (e.g., Z-direction) that changes length with a change in position of the encoder relative to the optical assembly, whereas for non-harmonic cyclic error beams, the measurement beam makes extra passes through the diagonal portion of the beam path (e.g., toward and away from reflector 40), and no extra passes through the Z portion of the beam path. The cyclic errors also are axis-dependent cyclic errors ("CE Ad"), because the cyclic error frequency ratios are different for the X and Z axes. Axis-dependent cyclic errors (including those with integer frequency ratios) produce cyclic error frequency offsets that are generally not an integer multiple of the combined Doppler shift due to the combination of the two frequency ratios, as illustrated below:

$$f_D = f_{DX} + f_{DZ} \quad (7)$$
$$f_{CE} = k_X f_{DX} + k_Z f_{DZ}$$
$$k_X \neq k_Z$$
$$\frac{f_{CE}}{f_D} = \frac{k_X f_{DX} + k_Z f_{DZ}}{f_{DX} + f_{DZ}} \neq \text{integer}$$

Where $f_{DX}$ and $f_{DZ}$ are X and Z Doppler shifts, $k_X$ and $k_Z$ are the X and Z cyclic error frequency ratios, $f_D$ is the effective or combined Doppler shift due to X and Z motion, and $f_{CE}$ is the effective cyclic error frequency offset relative to the heterodyne frequency.

Referring to FIGS. 4 and 6, the portion of the primary beam that travels along the cyclic error beam path makes two passes along the Z-direction (e.g., beam 10 and beam 28), i.e., the same number of passes along the Z-direction as the primary beam makes along the measurement path (e.g., beam 10 and beam 14). The portion of the primary beam that travels along the cyclic error path also makes six passes along the l direction (e.g., beam 12, beam 24, and beam 26). The number of incidences on the encoder scale is six. The equations for the beams in this specific interferometric encoder arrangement can be expressed as:

$$\Delta OPL_{NhA} = 2\Delta Z + 6\Delta l + 6\Delta X \sin\theta \quad (8)$$

$$OPL_{NhB} = 2\Delta Z + 6\Delta l - 6\Delta X \sin\theta \quad (9)$$

Using the same substitutions and identities as before gives:

$$\Delta\varphi_{NhA} = \frac{4\pi}{\lambda}\left[\Delta Z\left(1+3\sqrt{1-\left(\frac{\lambda}{s}\right)^2}\right)+3\Delta X\frac{\lambda}{s}\right] \quad (10)$$

And $$\Delta\varphi_{NhB} = \frac{4\pi}{\lambda}\left[\Delta Z\left(1+3\sqrt{1-\left(\frac{\lambda}{s}\right)^2}\right)-3\Delta X\frac{\lambda}{s}\right] \quad (11)$$

The X and Z phases have different contributions from the displacements and the Littrow cyclic errors. Equation (3) for stationary Z reduces to, for example, $$\Delta\varphi_X = \frac{4\pi}{s}\Delta X, \quad (12)$$

and for stationary X reduces to, for example, $$\Delta\varphi_Z \frac{4\pi}{\lambda}\Delta Z\left(1+\sqrt{1-\left(\frac{\lambda}{s}\right)^2}\right); \quad (13)$$

equation (10) for stationary Z reduces to, for example, $$\Delta\varphi_{NhX} = \frac{4\pi}{s}3\Delta X, \quad (14)$$

and for stationary X reduces to, for example, $$\Delta\varphi_{NhZ} = \frac{4\pi}{\lambda}\Delta Z\left(1+3\sqrt{1-\left(\frac{\lambda}{s}\right)^2}\right); \quad (15)$$

The cyclic error ratios (i.e., the ratio of the cyclic error frequency shift to the Doppler frequency) for X and Z motion of this example can be expressed as:

$$r_X = \frac{\Delta\varphi_{NhX}}{\Delta\varphi_X} = 3 \quad (16)$$

$$r_Z = \frac{\Delta\varphi_{NhZ}}{\Delta\varphi_Z} = \frac{1+3\sqrt{1-\left(\frac{\lambda}{s}\right)^2}}{1+\sqrt{1-\left(\frac{\lambda}{s}\right)^2}} \quad (17)$$

By inspection, knowing that $\lambda < s$ for use with a grating, the range of $r_Z$ is from slightly greater than 1 (with $\lambda \approx s$) to slightly less than 2 (with $\lambda \ll s$). Values approaching one are problematic since they make separation of the cyclic error from the signal more difficult when there is Z motion without X motion, or when determining the actual value of $r_Z$. For a combination of X and Z motion, the apparent cyclic error ratio on channel A or channel B may range from slightly more than 1 (with only Z motion) to 3 (with only X motion).

Cyclic Error Correction

In general, conventional electronic compensation techniques are not capable of compensating the cyclic errors having non-harmonic or axis-dependent characteristics. Conventional methods of electronic compensation generate integer harmonics of the Doppler signal with simple trigonometric manipulations, and cannot compensate non-harmonic cyclic errors. Conventional methods of electronic compensation process signals from a single axis without consideration of other axes, and cannot compensate axis-dependent cyclic errors. Although filtering can be used to reduce CE Nh and CE Ad errors during relatively high speed changes in position, filtering fails to reduce the non-harmonic and axis-dependent errors during relatively low speed operations, such as alignment. We now describe an approach for compensation of CE Nh and CE Ad errors in which the cyclic error frequency is identified and used to generate a prototype signal characteristic of the cyclic error. The prototype signal then is employed to compensate for the cyclic error(s). As a result, the cyclic error compensation approach advantageously improves in certain implementations the tolerance of interferometric encoder systems for optical, mechanical, or electronic imperfections and thus enhances performance and reduces operating costs.

In the present embodiment, we focus on a particular set of three cyclic error terms that are compensated at low slew rates, and one cyclic error term that is compensated at a Doppler frequency $f_D$ near $-f_R/2$, where $f_R$ is the reference frequency. These four cyclic errors are: the negative Doppler errors (CE N), with amplitude $\epsilon_{-1}$ and offset phase $\zeta_{-1}$; the zero Doppler errors (CE 0), with amplitude $\epsilon_0$ and offset phase $\zeta_0$; the non-harmonic errors (CE Nh) with amplitude $\epsilon_{Nh}$ and offset phase $\zeta_{Nh}$; and the baseband Doppler errors (CE B) with amplitude $\epsilon_B$ and offset phase $\zeta_B$. Adaptation to compensate for a different set of cyclic errors will be evident to one skilled in the art based on the information available in the art (see, e.g., U.S. Pat. Nos. 6,029,363, 6,950,192, 7,109,900, 7,250,881, 7,428,685, and 7,616,322, incorporated herein by reference in their entirety) and the subsequent description.

Referring again to FIG. 1, the output beam 1032 detected by the detector system 1030 contains a heterodyne interference signal corresponding to the interference signal S(t). The electrical interference signal S(t) includes four cyclic error terms and can be expressed in the form $$S(t) = A_1 \cos(\phi_R + \phi + \zeta_1) + S_\psi(t), \quad (18)$$

where the cyclic error components are represented by:

$$S_\psi(t) = S_{\psi-1}(t) + S_{\psi 0} + S_{\psi Nh}(t) + S_{\psi B}(t); \quad (19)$$

$$S_{\psi-1}(t) = \epsilon_{-1} \cos(\phi_R - \phi + \zeta_{-1}), \quad (20)$$

$$S_{\psi 0} = \epsilon_0 \cos(\phi_R + \zeta_0), \quad (21)$$

$$S_{\psi Nh}(t) = \epsilon_{Nh} \cos(\phi_R + \phi_{Nh} + \zeta_{Nh}), \text{ and} \quad (22)$$

$$S_{\psi B}(t) = \epsilon_B \cos(\phi + \zeta_B). \quad (23)$$

The parameter $\phi_R$ is the phase of a reference signal $S_R(t)$ with $d\phi_R/dt = \omega_R$ corresponding to $2\pi$ times the frequency difference of the measurement beam and reference beam components of the input beam to the interferometer.

The parameters $A_1$ and $\zeta_1$ are the amplitude and offset phase, respectively, of the primary component of the electrical interference signal. The parameters $\epsilon_N$, $\epsilon_0$, $\epsilon_{Nh}$ and $\epsilon_B$ are the amplitudes for the cyclic error terms. The parameters $\zeta_N$, $\zeta_0$, $\zeta_{Nh}$ and $\zeta_B$ are the offset phases of the cyclic error terms. The parameter $\phi = \phi_X + \phi_Z$ is the phase of the measurement signal due to displacement in the X and Z directions. The parameter $\phi_{Nh} = \phi_{NhX} + \phi_{NhZ}$ is the phase of the cyclic error due to displacement in the X and Z directions.

Each cyclic error results in a characteristic displacement cyclic error frequency in the measured displacement value; this frequency is the difference between the Doppler shifted measurement signal frequency and the measurement signal cyclic error signal frequency.

For CE 0, $f_0 = |f_D|$; (24)

for CE N, $f_N = |2f_D|$ (25)

for CE Nh with X motion, $f_{NhX} = (r_X - 1)|f_{DX}|$; (26)

for CE Nh with Z motion, $f_{NhZ} = (r_Z - 1)|f_{DZ}|$; (27)

for CE B, $f_B = |f_R + 2f_D|$, (28)

where $f_D$ is the effective or combined Doppler frequency, $f_{DX}$ is the Doppler frequency due to motion in the X direction, $f_{DZ}$ is the Doppler frequency due to motion in the Z direction; all frequencies are in Hertz, where $$f = \frac{1}{2\pi} \frac{d\varphi}{dt}.$$

The effective Doppler frequency is equal to $f_{DX}$ when there is no motion in the Z direction. Similarly, the effective Doppler frequency is equal to $f_{DZ}$ when there is no motion in the X direction.

CMS Compensation

We now describe cyclic error compensation using an interferometric encoder system such as, for example, the system 1000 shown in FIGS. 1 and 6. FIGS. 17 and 19-24, referred to below, are graphs illustrating results of exemplary simulations of the digital transform processing and cyclic error compensation math described herein as applied to a heterodyne interference signal. The simulations were performed using MATLAB® and Simulink® modeling software available from The MathWorks Inc.

Figure 7:
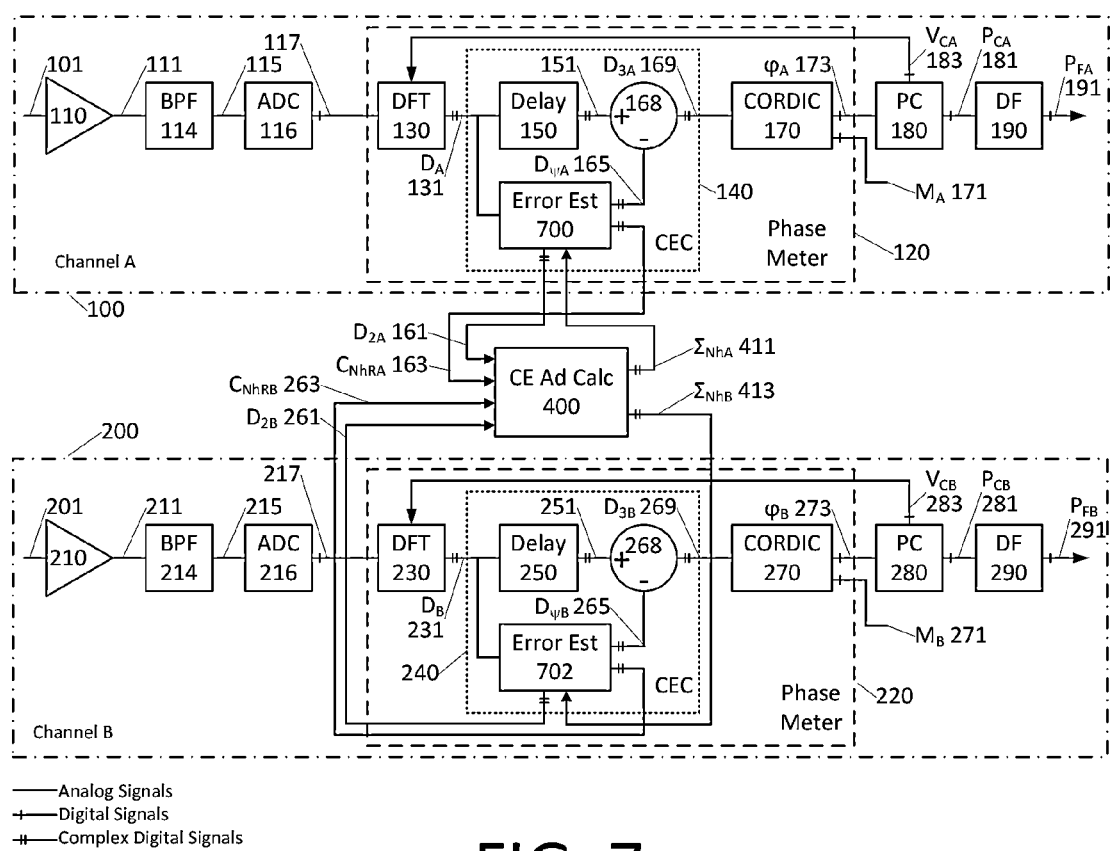
FIG. 7 is a schematic diagram of an example of a cyclic error compensation signal processing system.

Two channels, herein referred to as channel A and channel B, allow separation of X and Z motion. FIG. 7 is an example of a signal processing block that includes a first signal processing channel (channel A 100) and a second signal processing channel (channel B 200). Channel A 100 and channel B 200 can include the same components and perform the same type of operations in the same order. Accordingly, a detailed description of the operation of channel B 200 is omitted here.

Equations (5) and (6) may be expressed as phase differences by removing the scaling constants, giving, for example:

$$\varphi_X = \frac{\varphi_A - \varphi_B}{2} \quad (29)$$

$$\varphi_Z = \frac{\varphi_A + \varphi_B}{2} \quad (30)$$

Equations (29) and (30) can be solved for $\phi_A$ and $\phi_B$, which can be expressed as:

$$\phi_A = \phi_X + \phi_Z \quad (31)$$

$$\phi_B = \phi_X - \phi_Z \quad (32)$$

The phases are unwrapped or accumulated to provide corresponding unscaled position values for the A and B channels, where the unscaled position values can be expressed as:

$$P_{FA} \cong P_{CA} \cong P_A = \Sigma\Delta\phi_A \quad (33)$$

$$P_{FB} \cong P_{CB} \cong P_B = \Sigma\Delta\phi_B. \quad (34)$$

The unscaled position values in equations (33) and (34) may be substituted into equations (5) and (6) and the scaling removed to provide position values for the X and Z directions, which can be expressed as:

$$P_X = \frac{P_A - P_B}{2} \quad (35)$$

$$P_Z = \frac{P_A + P_B}{2}. \quad (36)$$

We now describe a complex measurement signal (CMS) approach for cyclic error compensation (CEC), in which a cyclic error compensation signal $D_{\psi A}(t)$ modifies a corresponding DFT signal $D_A(t)$ of the electrical interference signal $S(t)$ for channel A to produce a compensated DFT signal. FIG. 7 is a simplified schematic diagram of an example measurement using the CMS approach.

The cyclic error compensation signal $D_{\psi A}(t)$, also called complex error compensation signal, can be understood to mean a signal calculated to attenuate the contribution of cyclic errors, including non-harmonic cyclic errors, in the electrical interference signal obtained by an interferometric encoder system such as, for example, system 1000. The cyclic error compensation signal $D_{\psi A}(t)$ is calculated based in part on the non-harmonic cyclic error signal $S_{\psi Nh}(t)$. The cyclic error compensation signal also can be calculated based on in part on one or more of a signal corresponding to the negative Doppler error $S_{\psi -1}(t)$, a signal corresponding to the zero Doppler error $S_{\psi 0}$, and/or a signal corresponding to the baseband Doppler error $S_{\psi B}(t)$. In some embodiments, the cyclic error compensation signal also can be calculated based on axis-dependent errors, such as cyclic errors that arise when the relative position of the encoder scale varies in multiple orthogonal directions (e.g., along the X-direction and along the Z-direction).

The optical interference signal 101 is received and amplified by photoelectric receiver 110. The resulting electrical interference signal 111 is filtered by bandpass filter (BPF) 114 producing filtered signal 115. The BPF 114 is designed to prevent DC signal, noise and harmonics of the interference signal 111 from being aliased into the frequency range of interest. Filtered signal 115 is digitized by analog-to-digital converter (ADC) 116, to produce digitized measurement signal 117. A typical ADC for a high performance displacement measuring interferometer may have 12 bits of resolution at sampling rates of 120 MHz. The digitized measurement signal 117 is processed by phase meter 120 (described below) to produce outputs magnitude $M_A$ 171 and phase $\phi_A$ 173 which represent the digitized measurement signal 117 at the measurement signal frequency. The magnitude output $M_A$ 171 is used for status and diagnostic purposes. The phase output $\phi_A$ 173 is used by position calculator 180, which is described in U.S. Pat. No. 6,975,406, incorporated herein by reference in its entirety. Position calculator 180 calculates measured position $P_{CA}$ 181 and estimated velocity $V_{CA}$ 183. The measured position $P_{CA}$ 181 is filtered by digital filter 190, which is described in U.S. Pat. No. 5,767,972, incorporated herein by reference in its entirety, to generate filtered position signal $P_{FA}$ 191.

Channel A 100 filtered position signal $P_{FA}$ 191 represents X and Z motion as described in equations (3) and (33). Channel B 200 filtered position signal $P_{FB}$ 291 represents X and Z motion as described in equations (4) and (34). The X and Z motion is decoded, for example, as described in equations (35) and (36) respectively.

Phase meter 120 includes a Discrete Fourier Transform (DFT) processor 130, a CEC calculator 140, and a Coordinate Rotation by Digital Computer (CORDIC) converter 170. Signals 131, 151, 161, 163, 165, 169 and 411 are signals in complex space and thus have complex values, which consist of both a real component and an imaginary component, as a+jb, where a is the real component, b is the imaginary component, and j is $\sqrt{-1}$. Other representations of complex or quadrature values can be used, and may be expressed using other symbols such as, for example, I and Q, or X and Y, or A and Ã. Complex values may be converted from rectangular (real and imaginary) representation to polar (magnitude and phase angle) representation. The numeric representation of the digital signals may be integer, fixed point, or floating point.

The DFT processor 130 converts a series of consecutive samples of digitized measurement signal 117 into a complex measurement signal $D_A$ 131 representing a transform of the digitized measurement signal 117 at a selected center frequency of DFT processor 130. That is, the DFT processor 130 applies a frequency transformation to the digitized measurement signal, in which the digitized measurement signal is converted from a representation in time to a representation in frequency space. The center frequency is determined by control circuitry (not shown) and the estimated velocity $V_{CA}$ 183 as determined by position calculator 180.

An exemplary DFT processor 130 is a 72-point windowed DFT performed at a 10 MHz rate. Since the DFT calculation is being updated in time, the complex measurement signal D(t) 131 is expressed as a function of time t. This 10 MHz update rate provides 83% overlap of samples of the digitized measurement signal 117 between one DFT calculation and the next for an ADC sampling rate of $f_s$=120 MHz. A typical window function is the Blackman window, which reduces errors due to the discontinuities at the beginning and end of the series of digitized measurement signal samples used for the DFT.

At the DFT processor 130, the output signal can be expressed as:

$$D(t_1) = A_1[\cos(\phi(t_1)+\zeta_1)-j\sin(\phi(t_1)+\zeta_1)]+D_\psi(t_1) \quad (37)$$

Where the cyclic error components are represented by $$D_\psi(t_1) = D_{\psi N}(t_1)+D_{\psi 0}+D_{\psi Nh}(t_1)+D_{\psi B}(t_1); \quad (38)$$

$$D_{\psi N}(t_1) = \epsilon_N[\cos(-\phi(t_1)+\zeta_N)-j\sin(-\phi(t_1)+\zeta_N)], \quad (39)$$

$$D_{\psi 0} = \epsilon_0[\cos(\zeta_0)-j\sin(\zeta_0)], \quad (40)$$

$$D_{\psi Nh}(t_1) = \epsilon_{Nh}[\cos(\phi_{Nh}(t_1)+\zeta_{Nh})-j\sin(\phi_{Nh}(t_1)+\zeta_{Nh})], \quad (41)$$

$$D_{\psi B}(t_1) = \epsilon_B[\cos(-\phi(t_1)+\zeta_B)-j\sin(-\phi(t_1)+\zeta_B)], \quad (42)$$

where $\phi(t_1)$ is the value of the Doppler phase shift $\phi(t_1)=\omega_D t_1+\phi_0$ that is updated with $t_1$ and $\phi_{Nh}(t_1)$ is the value of the non-harmonic phase shift $\phi_{Nh}(t_1)=\omega_{Nh}t_1+\phi_0$ that is updated with $t_1$.

The processing details for CE 0, CE N and CE B are described, for example, in U.S. Patent App. Pub. No. 2012/0154780 and U.S. Pat. Nos. 6,950,192, 7,428,685, 7,616,322, each of which is incorporated herein by reference. Therefore, a description of CE 0, CE N and CE B processing is omitted here.

Combining equations (37) and (41) for CE Nh in both the A and B channels and dropping the ($t_1$) for clarity:

$$D_A = A_{1A}[\cos(\varphi_A + \zeta_{1A}) - j\sin(\varphi_A + \zeta_{1A})] + \qquad (43)$$
$$\varepsilon_{NhA}[\cos(\varphi_{NhA} + \zeta_{NhA}) - j\sin(\varphi_{NhA} + \zeta_{NhA})]$$

$$D_B = A_{1B}[\cos(\varphi_B + \zeta_{1B}) - j\sin(\varphi_B + \zeta_{1B})] + \qquad (44)$$
$$\varepsilon_{NhB}[\cos(\varphi_{NhB} + \zeta_{NhB}) - j\sin(\varphi_{NhB} + \zeta_{NhB})]$$

By combining equations (29), (30), (16), (17), (31), and (32) the cyclic error phase arguments of equations (43) and (44) may be expressed as:

$$\varphi_{NhA} + \zeta_{NhA} = \frac{(r_X + r_Z)}{2}(\varphi_A + \zeta_A) + \frac{(-r_X + r_Z)}{2}(\varphi_B + \zeta_{1B}) \qquad (45)$$

$$\varphi_{NhB} + \zeta_{NhB} = \frac{(-r_X + r_Z)}{2}(\varphi_A + \zeta_A) + \frac{(r_X + r_Z)}{2}(\varphi_B + \zeta_{1B})$$

Where the X and Z cyclic error frequency ratios ranges as described with equations (16) and (17):

$$r_X = 3$$

$$1 < r_Z < 2 \qquad (46)$$

Figure 17:
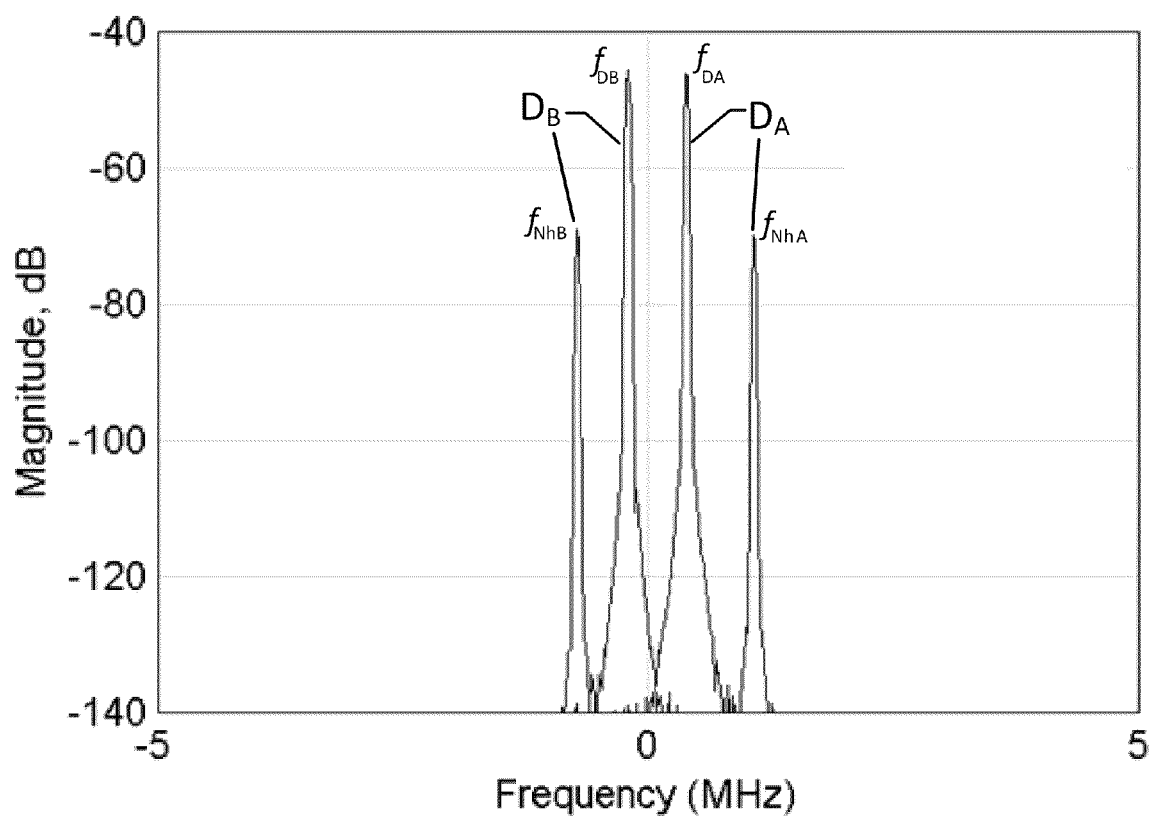
FIG. 17 is a plot illustrating an example of non-harmonic cyclic error spectrum.

FIG. 17 is a plot that shows an example of $D_A$ and $D_B$ for a 7% (−23 dB) non-harmonic cyclic error magnitude. The frequencies of the spectral peaks are indicated on the figures and can be expressed as:

$$f_{DA} = \frac{1}{2\pi}\frac{d\varphi_A}{dt} \qquad (47)$$

$$f_{DB} = \frac{1}{2\pi}\frac{d\varphi_B}{dt}$$

$$f_{NhA} = \frac{1}{2\pi}\frac{d\varphi_{NhA}}{dt}$$

$$f_{NhB} = \frac{1}{2\pi}\frac{d\varphi_{NhB}}{dt}.$$

Figure 18:
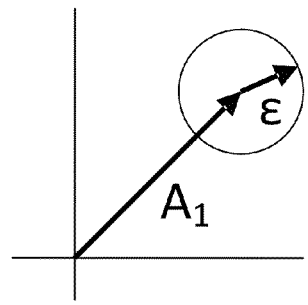
FIG. 18 is a vector plot of an example of a cyclic error.

For small magnitudes of cyclic errors, the cyclic errors may be imagined as rotating vectors. For example, FIG. 18 is a plot that shows the signal as a combination of vectors, with the vector corresponding to the cyclic error, having a magnitude ϵ and rotated from the ideal signal, which has a magnitude A.

Thus, the magnitude and phase of a signal with a cyclic error may be approximated as:

$$M = |D| \cong A_1 + \varepsilon_{Nh}\cos(\varphi_{Nh} + \zeta_{Nh} - \varphi - \zeta_1) \qquad (48)$$
and $$Ph \cong (\varphi + \zeta_1) + \frac{\varepsilon_{Nh}}{A_1}\sin(\varphi_{Nh} + \zeta_{Nh} - \varphi - \zeta_1). \qquad (49)$$

A more rigorous analysis could express the magnitude and phase as Bessel function series, similar to large phase deviation phase modulation (see, e.g., Schwartz, M; Information Transmission, Modulation, and Noise, Third Edition; McGraw Hill, 1980; pp. 271-278). This is not necessary in this case because the maximum cyclic error amplitude $$\frac{\varepsilon_{Nh}}{A_1}$$

is typically less than 10%, or 0.1 radian, and the error due to the above approximation is small.

CE Ad calculator 400 processes partially compensated signals $D_{2A}$ 161 and $D_{2B}$ 261 from error estimators 700 and 702 to calculate complex prototype signals $\Sigma_{NhA}$ 411 and $\Sigma_{NhB}$ 413 for the error estimators. In some embodiments, the complex prototype signals 411 and 413 represent the frequency or frequencies of certain cyclic errors, such as the non-harmonic cyclic error signal associated with the measured interference signal. This is described in more detail below with reference to the example of FIG. 9.

The CEC calculator 140 calculates and compensates for certain of the cyclic errors. CEC error estimator 700 (described in more detail below with reference to FIG. 8) calculates complex error compensation signal $D_{\psi A}$ 165. Optional delay 150, and other delays (not shown) in CEC calculator 140, CEC calculator 240 and CE Nh calculator 400 may be used to match the processing delay of the various calculations. Adder 168 combines delayed complex measurement signal 151 with complex error compensation signal $D_{\psi A}$ 165 (e.g., deducts complex error compensation signal $D_{\psi A}$ 165 from complex measurement signal 151) to produce compensated complex measurement signal $D_{3A}$ 169, in which the certain cyclic error signals are substantially reduced. That is, the complex error compensation signal $D_{\psi A}$ 165 is deducted from the complex measurement signal 151 so as to attenuate certain cyclic error signals in the complex measurement signal 151. Though complex error compensation signal $D_{\psi A}$ 165 is shown as being subtracted from the complex measurement signal, a version of the complex error compensation signal having an opposite polarity or phase shift also could be added to the complex measurement signal. CORDIC converter 170 converts the compensated complex measurement signal $D_{3A}$ 169 to magnitude $M_A$ 171 and phase $\phi_A$ 173.

Error Estimator

Figure 8:
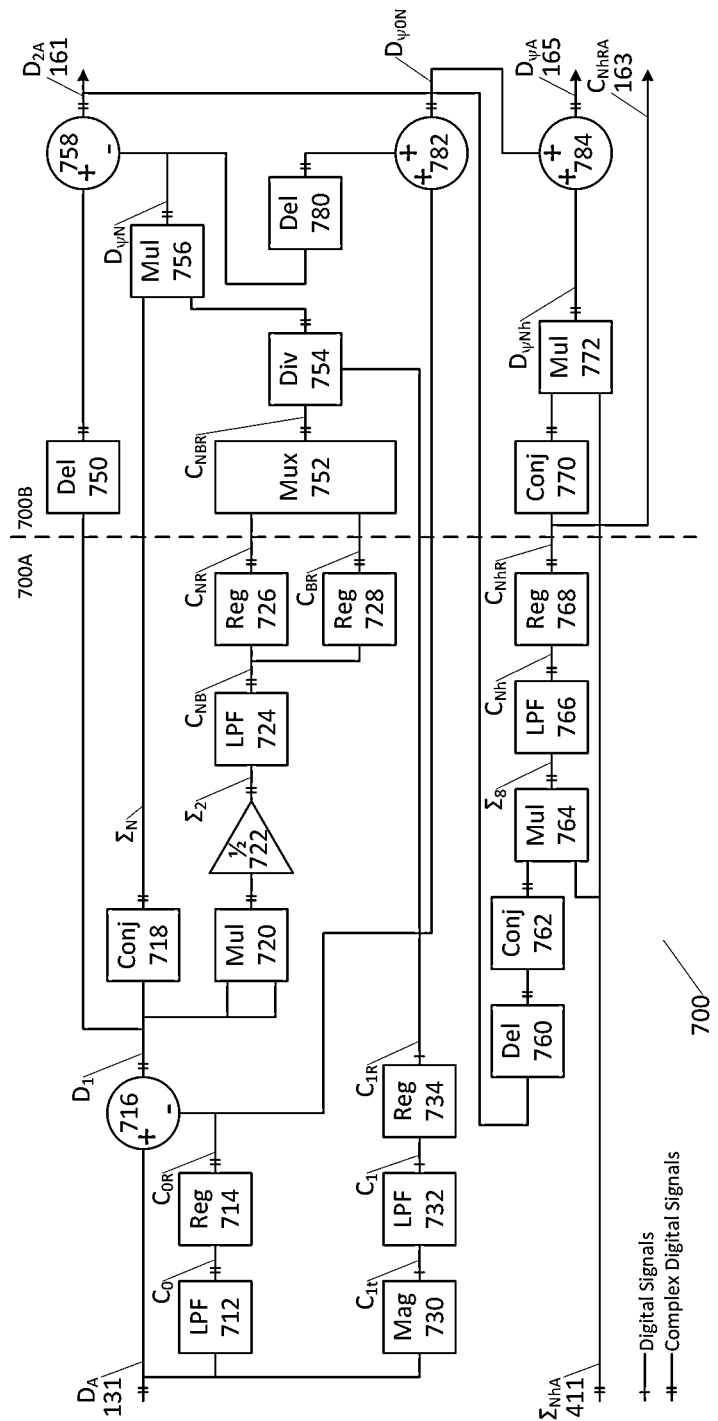
FIG. 8 is a schematic diagram of an example of an error estimator.

Error estimators 700 and 702 as shown in FIG. 7 have similar operations. Accordingly, for the purposes of convenience, only error estimator 700 will be described. FIG. 8 is a schematic of an example CEC error estimator 700. The CEC error estimator 700 includes two processing units. One processing unit 700A determines complex prototype signals and complex factors relating to the amplitudes and offset phases of the certain cyclic errors that need be compensated. In some embodiments, the complex prototype signals represent the frequency or frequencies of the non-harmonic cyclic error signals associated with the measured interference signals. A second processing unit 700B generates complex error compensation signal $D_{\psi A}$ 165 with the appropriate amplitudes and offset phases using the complex prototype signals and complex factors relating to the amplitudes and offset phases determined by first processing unit 700A.

These processing units are incorporated into the architecture shown in FIG. 7 that may also include any of a variety of other techniques such as a glitch filter (as described, for example, in U.S. Pat. No. 6,975,406, incorporated herein by reference), dynamic data age adjustment (as described, for example, in U.S. Pat. No. 6,597,459, incorporated herein by reference), and digital filtering (as described, for example, in U.S. Pat. No. 5,767,972, incorporated herein by reference).

The first order cyclic error term whose phase is independent of $\phi_R$ is included in Equation (18) as $S_{\psi B}(t)$. The set of higher order cyclic error terms whose phases are independent of $\phi_R$ has been omitted from Equation (18) because they are generally insignificant.

Complex factors relating to amplitudes $\epsilon_p$ and offset phases $\zeta_p$ of the CE N, CE 0, and CE B cyclic error terms and corresponding complex prototype signals are generated using processed signal $D_A$ 131 from DFT processor 130. A real factor related to the amplitude of signal $D_A$ is also generated. The factors are stored in registers 714, 726, 728 and 734 for subsequent use in generation of the negative baseband cyclic error compensation signal $D_{\psi 0N}$ and partially compensated measurement signal $D_{2A}$ 161. This compensation is identical to the compensation described, for example, in U.S. Patent Application Pub. No. 2012/0154780. In this example, $D_{2A}$ includes compensation for CE 0, CE N and CE B.

A complex factor relating to amplitude $\epsilon_{Nh}$ and offset phase $\zeta_{Nh}$ of the non-harmonic (Nh) cyclic error term can be generated using partially compensated signal $D_{2A}$ 161 and complex prototype signal $S_{NhA}$ 411 from CE Ad calculator 400 (described later). Complex prototype signal $S_{NhA}$ 411 is multiplied by the delayed complex conjugate of partially compensated signal $D_{2A}$ 161. The delay 760 is used to match the delays of the two inputs to multiplier 764. Complex multiplier 764 output $\Sigma_8$ contains terms related to the frequency differences between the components of signals $D_{2A}$ 161 and $S_{NhA}$ 411. Lowpass filter 766 substantially suppresses the higher frequency terms and reduces noise, leaving DC term $C_{Nh}$, where the DC term contains the complex factor relating to amplitude $\epsilon_{Nh}$ and offset phase $\zeta_{Nh}$ of the non-harmonic (Nh) cyclic error term. The lowpass filter can include a cascaded integrator-comb (CIC) filter (described, for example, in the U.S. Pat. No. 7,428,685, incorporated herein by reference in its entirety). The order of the filter and the stopband frequency can be chosen based on the frequency range where compensation is used, and the suppression of the higher frequencies to obtain the desired measurement accuracy. The non-harmonic cyclic error term $C_{Nh}$ is passed through register 768 as $C_{NhR}$. When the control circuitry of the interferometry system determines that the difference between the Doppler frequency and the non-harmonic cyclic error frequency is below a specified threshold for calculation of $C_{Nh}$, register 768 holds the previous value as $C_{NhR}$. The threshold can be implemented based one of several choices: (1) A and/or B-channel Doppler frequency (assumes Doppler frequency due to motion along Z-direction is small); (2) Doppler frequency due to motion along the X-direction (assumes Doppler frequency due to motion along Z-direction is small); or (3) the difference between the A-channel non-harmonic cyclic frequency and the Doppler frequency recorded by channel A ($f_{NhA}$-$f_{DopplerA}$) and/or the difference between the B-channel non-harmonic cyclic frequency and the Doppler frequency recorded by channel B ($f_{NhB}$-$f_{DopplerB}$). In each case, the frequencies can be calculated by a position calculator or digital filter velocity output, or by deducting time-delayed values.

The factor stored in register 768 is subsequently used in generation of the non-harmonic cyclic error compensation signal $D_{\psi Nh}$ by complex conjugate 770 and complex multiplier 772. The CE Nh correction signal $D_{\psi Nh}$ is combined with the correction signal for the Zero Doppler, Negative Doppler, and Baseband cyclic errors $D_{\psi 0N}$ at adder 784 to produce cyclic error compensation signal $D_{\psi A}$ 165. In general, the compensation of non-harmonic errors can be achieved after performing correction of CE 0, CE N and CE B errors. Alternatively, error compensation can be performed in different orders including, for example, serially with parallel correction of CE 0, CE Nh errors, followed by CE N correction and optionally CE B correction or by CE B correction and then optionally CE N correction. In another example, error correction can be performed in series/parallel with CE 0 correction performed first then CE N correction or CE B correction in parallel with CE Nh correction.

Operations of error estimator 700 can be performed using other mathematical combinations as well. For example, in some implementations, complex conjugate operation 762 and complex conjugate operation 770 can be removed from the error estimator 700 whereas one or more other complex conjugate operations can be added to the output of the error estimator 700. Alternatively, or in addition complex conjugate operations can be added to the input of one or more multipliers (e.g., multiplier 764 and/or multiplier 772).

CE Ad Calculator

Referring to the example of FIG. 7, CE Ad calculator 400 uses partially compensated signals $D_{2A}$ 161 and $D_{2B}$ 261 to calculate complex prototype signals $S_{NhA}$ 411 and $S_{NhB}$ 413. This example calculates complex prototype signals for non-harmonic (Nh) axis-dependent (Ad) cyclic error correction based on knowledge of both X and Z motion. Previous cyclic error compensation methods use mathematical processing of the signal to create various integer multiples of the Doppler shift frequency to create the complex prototype signals for a single axis. However, for non-integer cyclic errors, integer multiples of the Doppler shift frequency are not adequate. Additionally, for axis-dependent cyclic errors, signals from multiple axes are required, and the previous compensation methods are not applicable.

Figure 9:
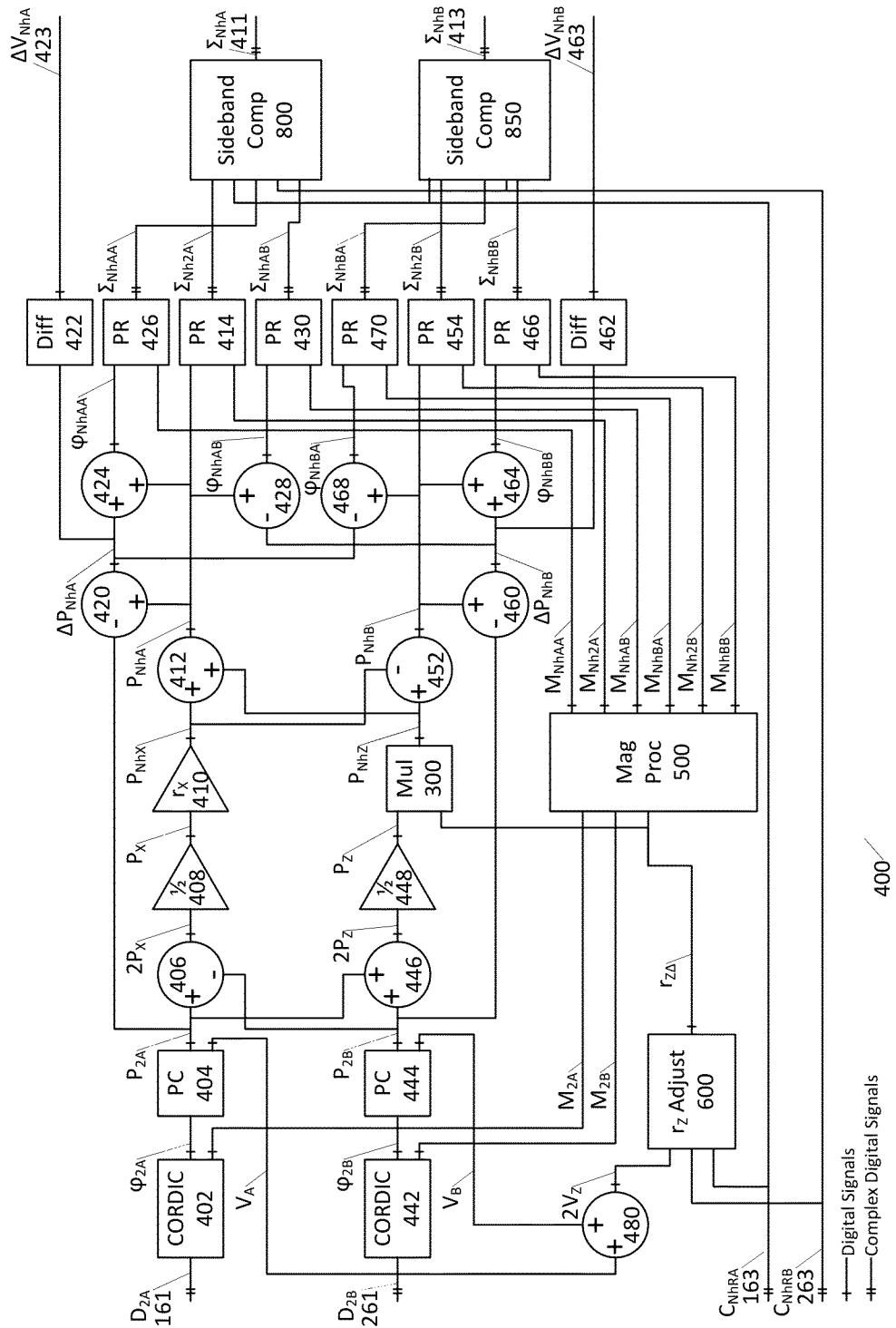
FIG. 9 is a schematic diagram of an example of a signal processor.

FIG. 9 is a schematic of an example of a signal processor, the CE Ad calculator 400. CE Ad calculator 400 converts complex partially compensated signals $D_{2A}$ 161 and $D_{2B}$ 261 to their respective instantaneous magnitude values $M_{2A}$ and $M_{2B}$, and their respective instantaneous phase values $\phi_{2A}$ and $\phi_{2B}$. This conversion may be with CORDIC converters identical to CORDIC 170 and CORDIC 270 in the phase meter shown in FIG. 7, or by any other equivalent method.

The phase values $\phi_{2A}$ and $\phi_{2B}$ are processed by position calculators (PC) 404 and 444 to "unwrap" or eliminate all $2\pi$ discontinuities and produce partially compensated position values $P_{2A}$ and $P_{2B}$. This unwrapping is necessary because $2\pi$ discontinuities multiplied by non-integer values in subsequent steps would otherwise result in non-$2\pi$ discontinuities that cannot be removed. The unwrapping and later reduction modulo $2\pi$ has no mathematical effect other than management of $2\pi$ discontinuities so that the signal processing works properly and is readily implemented. Various methods for unwrapping are available, including, for example, using a glitch filter. An example of a glitch filter is described in U.S. Pat. No. 6,975,406, incorporated herein by reference in its entirety. For descriptive purposes, the position and phase units are maintained as radians, although the position units may be other more convenient units, for example $2\pi/2^N$, where N is a positive integer. The position calculators may be identical to PC 180 and PC 280 shown in FIG. 7.

In some embodiments, digital filters may be included after PC 404 and PC 444 to reduce sidebands on $P_{2A}$ and $P_{2B}$ due to cyclic errors. However, the use of digital filters has a reduced or minimal effect when the change in relative position of the target object occurs at a relatively low or zero velocity.

The $P_{2A}$ and $P_{2B}$ position values are combined by adders 406 and 446 to produce estimated position values $2P_X$ and $2P_Z$, representing X and Z motion. The extraneous factor of two may be incorporated into other calculations, or may be removed by explicit scaling as shown by multipliers 408 and 448 producing $P_X$ and $P_Z$. This can be expressed as:

$$P_X = (P_{2A} - P_{2B})/2$$

$$P_Z = (P_{2A} + P_{2B})/2 \quad (50)$$

Multipliers 410 and 300 scale the X and Z positions $P_X$ and $P_Z$ by $r_X$ and $r_Z$ respectively to be $P_{NhX}$ and $P_{NhZ}$; these values represent the time-varying position or phase of the X and Z non-harmonic cyclic errors. In this example, $r_X$ is a constant integer value of 3 and $r_Z$ is a non-integer with a value between 1 and 2.

The calculation of the non-harmonic axis-dependent cyclic error positions can be expressed as:

$$P_{NhX} = r_X P_X$$

$$P_{NhZ} = r_Z P_Z \quad (51)$$

Figure 14:
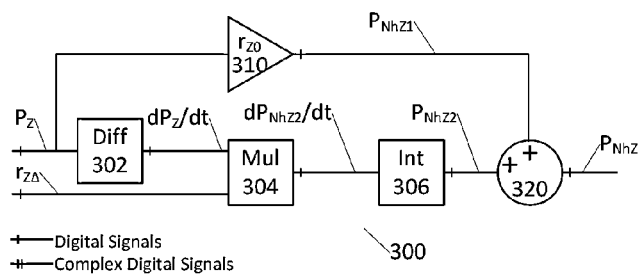
FIG. 14 is a schematic diagram of an example of a continuous multiplier.

In some embodiments, $r_Z$ is not precisely known, or may vary due to changes in measurement position, geometry or environment, so special consideration is required. Adder 480 calculates the Z velocity as the sum of the A and B velocities from position calculators 404 and 444. The $r_Z$ Adjuster 600 (described below with reference to FIG. 11) processes the Z velocity and time-varying changes in the Nh compensation coefficients $C_{NhRA}$ and $C_{NhRA}$ to calculate $r_Z$ adjustment value $r_{Z\Delta}$. Continuous Multiplier 300 (described below with reference to FIG. 14) uses the $r_{Z\Delta}$ value with initial $r_Z$ value $r_{Z0}$ to calculate the non-harmonic cyclic error position or phase $P_{NhZ}$. Magnitude Processor 500 uses the $r_{Z\Delta}$ value as described below with reference to FIG. 10.

In some embodiments, $r_Z$ is constant, or has uncertainty or variations sufficiently small to be ignored, and multiplier 300 may be a conventional multiplier (e.g., an ordinary product, not a continuous multiplier).

The values $P_{NhX}$ and $P_{NhZ}$ are combined by adders 412 and 452 to produce position values $P_{NhA}$ and $P_{NhB}$ which represent the time-varying position or phase of the non-harmonic cyclic error signals in channels A and B. The values $P_{NhA}$ and $P_{NhB}$ can be expressed as:

$$P_{NhA} = P_{NhX} + P_{NhZ}$$

$$P_{NhB} = -P_{NhX} + P_{NhZ} \quad (52)$$

Combining equations (50), (51) and (52); and grouping the $P_{2A}$ and $P_{2B}$ terms, gives:

$$P_{NhA} = \frac{(r_{NhX} + r_{NhZ})}{2} P_{2A} + \frac{(-r_{NhX} + r_{NhZ})}{2} P_{2B}$$

$$P_{NhB} = \frac{(-r_{NhX} + r_{NhZ})}{2} P_{2A} + \frac{(r_{NhX} + r_{NhZ})}{2} P_{2B} \quad (53)$$

Expanding equations (53) using equation (49) for $P_A$ and $P_B$ gives:

$$P_{NhA} = \frac{(r_X + r_Z)}{2}\left((\varphi_A + \zeta_{1A}) + \frac{\varepsilon_{NhA}}{A_{1A}}\sin(\varphi_{NhA} + \zeta_{NhA} - \varphi_A - \zeta_{1A})\right) + \frac{(-r_X + r_Z)}{2}\left((\varphi_B + \zeta_{1B}) + \frac{\varepsilon_{NhB}}{A_{1B}}\sin(\varphi_{NhB} + \zeta_{NhB} - \varphi_B - \zeta_{1B})\right) \quad (54)$$

$$P_{NhB} = \frac{(-r_X + r_Z)}{2}\left((\varphi_A + \zeta_{1A}) + \frac{\varepsilon_{NhA}}{A_{1A}}\sin(\varphi_{NhA} + \zeta_{NhA} - \varphi_A - \zeta_{1A})\right) + \frac{(r_X + r_Z)}{2}\left((\varphi_B + \zeta_{1B}) + \frac{\varepsilon_{NhB}}{A_{1B}}\sin(\varphi_{NhB} + \zeta_{NhB} - \varphi_B - \zeta_{1B})\right)$$

Substituting equation (45) and regrouping gives:

$$P_{NhA} = (\varphi_{NhA} + \zeta_{NhA}) + \frac{(r_X + r_Z)}{2}\frac{\varepsilon_{NhA}}{A_{1A}}\sin(\varphi_{NhA} + \zeta_{NhA} - \varphi_A - \zeta_{1A}) + \frac{(-r_X + r_Z)}{2}\frac{\varepsilon_{NhB}}{A_{1B}}\sin(\varphi_{NhB} + \zeta_{NhB} - \varphi_B - \zeta_{1B}) \quad (55)$$

$$P_{NhB} = (\varphi_{NhB} + \zeta_{NhB}) + \frac{(-r_X + r_Z)}{2}\frac{\varepsilon_{NhA}}{A_{1A}}\sin(\varphi_{NhA} + \zeta_{NhA} - \varphi_A - \zeta_{1A}) + \frac{(r_X + r_Z)}{2}\frac{\varepsilon_{NhB}}{A_{1B}}\sin(\varphi_{NhB} + \zeta_{NhB} - \varphi_B - \zeta_{1B})$$

The values $P_{2A}$ and $P_{2B}$ are deducted from $P_{NhA}$ and $P_{NhB}$ respectively to provide position differences $\Delta P_{NhA}$ and $\Delta P_{NhB}$. Position differences are differentiated by 422 and 462 to provide velocity differences $\Delta V_{NhA}$ 423 and $\Delta V_{NhB}$ 463, which represent the difference in frequency between the Doppler signal and the corresponding Littrow cyclic error signal. In some embodiments, the maximum Z velocity is sufficiently small that $V_A$ and $V_A$ or other equivalent signals may be used instead of $\Delta V_{NhA}$ and $\Delta V_{NhB}$. These signals are provided to control circuitry in the hardware of the interferometer system that causes the CE Nh coefficient registers (see, e.g., Reg 768) to hold the current value when a frequency difference is too low (or when a speed of the encoder scale relative to the optical assembly is too low) for proper calculation of coefficients.

In an example embodiment, the non-harmonic cyclic error position values $P_{NhA}$ and $P_{NhB}$ are used to create complex prototype signals $\Sigma_{Nh1A}$ and $\Sigma_{Nh1B}$, where the complex prototype signals can be expressed as:

$$\Sigma_{Nh1A} = \sin(P_{NhA}) + i\cos(P_{NhA})$$

$$\Sigma_{Nh1B} = \sin(P_{NhB}) + i\cos(P_{NhB}) \quad (56)$$

Substituting equations (55) for $P_{NhA}$ and $P_{NhB}$ into equations (56) gives:

$$\Sigma_{Nh1A} = \sin\left(\begin{array}{l}(\varphi_{NhA} + \zeta_{NhA}) + \\ \frac{(r_X + r_Z)}{2}\frac{\varepsilon_{NhA}}{A_{1A}}\sin(\varphi_{NhA} + \zeta_{NhA} - \varphi_A - \zeta_{1A}) + \\ \frac{(-r_X + r_Z)}{2}\frac{\varepsilon_{NhB}}{A_{1B}}\sin(\varphi_{NhB} + \zeta_{NhB} - \varphi_B - \zeta_{1B})\end{array}\right) + i\cos\left(\begin{array}{l}(\varphi_{NhA} + \zeta_{NhA}) + \\ \frac{(r_X + r_Z)}{2}\frac{\varepsilon_{NhA}}{A_{1A}}\sin(\varphi_{NhA} + \zeta_{NhA} - \varphi_A - \zeta_{1A}) + \\ \frac{(-r_X + r_Z)}{2}\frac{\varepsilon_{NhB}}{A_{1B}}\sin(\varphi_{NhB} + \zeta_{NhB} - \varphi_B - \zeta_{1B})\end{array}\right) \quad (57)$$

$$\Sigma_{Nh1B} = \sin\left(\begin{array}{l}(\varphi_{NhB} + \zeta_{NhB}) + \\ \frac{(-r_X + r_Z)}{2}\frac{\varepsilon_{NhA}}{A_{1A}}\sin(\varphi_{NhA} + \zeta_{NhA} - \varphi_A - \zeta_{1A}) + \\ \frac{(r_X + r_Z)}{2}\frac{\varepsilon_{NhB}}{A_{1B}}\sin(\varphi_{NhB} + \zeta_{NhB} - \varphi_B - \zeta_{1B})\end{array}\right) + i\cos\left(\begin{array}{l}(\varphi_{NhB} + \zeta_{NhB}) + \\ \frac{(-r_X + r_Z)}{2}\frac{\varepsilon_{NhA}}{A_{1A}}\sin(\varphi_{NhA} + \zeta_{NhA} - \varphi_A - \zeta_{1A}) + \\ \frac{(r_X + r_Z)}{2}\frac{\varepsilon_{NhB}}{A_{1B}}\sin(\varphi_{NhB} + \zeta_{NhB} - \varphi_B - \zeta_{1B})\end{array}\right)$$

For $$\frac{\varepsilon_{LA}}{A_{1A}} < 10\%, \frac{\varepsilon_{LB}}{A_{1B}} < 10\% \text{ and } 1 < k_{LZ} < 2,$$

the maximum phase deviation is 0.25 radians and equations (57) may be analyzed as representing narrow band phase modulation (see, e.g., Schwartz, M.; Information Transmission, Modulation, and Noise, Third Edition; McGraw Hill, 1980; pp 263-267). The resulting signals can be approximately represented as:

$$\Sigma_{Nh1A} = \begin{pmatrix} \sin(\varphi_{NhA} + \zeta_{NhA}) + \\ \frac{1}{2}\frac{(r_X + r_Z)}{2}\frac{\varepsilon_{NhA}}{A_{1A}}\sin\begin{pmatrix}(\varphi_{NhA} + \zeta_{NhA}) \pm \\ (\varphi_{NhA} + \zeta_{NhA} - \varphi_A - \zeta_{1A})\end{pmatrix} + \\ \frac{1}{2}\frac{(-r_X + r_Z)}{2}\frac{\varepsilon_{NhB}}{A_{1B}}\sin\begin{pmatrix}(\varphi_{NhA} + \zeta_{NhA}) \pm \\ (\varphi_{NhB} + \zeta_{NhB} - \varphi_B - \zeta_{1B})\end{pmatrix} \end{pmatrix} + $$

$$i\begin{pmatrix} \cos(\varphi_{NhA} + \zeta_{NhA}) + \\ \frac{1}{2}\frac{(r_X + r_Z)}{2}\frac{\varepsilon_{NhA}}{A_{1A}}\sin\begin{pmatrix}(\varphi_{NhA} + \zeta_{NhA}) \pm \\ (\varphi_{NhA} + \zeta_{NhA} - \varphi_A - \zeta_{1A})\end{pmatrix} + \\ \frac{1}{2}\frac{(-r_X + r_Z)}{2}\frac{\varepsilon_{NhB}}{A_{1B}}\sin\begin{pmatrix}(\varphi_{NhA} + \zeta_{NhA}) \pm \\ (\varphi_{NhB} + \zeta_{NhB} - \varphi_B - \zeta_{1B})\end{pmatrix} \end{pmatrix}$$

(58)

$$\Sigma_{Nh1B} = \begin{pmatrix} \sin(\varphi_{NhB} + \zeta_{NhB}) + \\ \frac{1}{2}\frac{(-r_X + r_Z)}{2}\frac{\varepsilon_{NhA}}{A_{1A}}\sin\begin{pmatrix}(\varphi_{NhB} + \zeta_{NhB}) \pm \\ (\varphi_{NhA} + \zeta_{NhA} - \varphi_A - \zeta_{1A})\end{pmatrix} + \\ \frac{1}{2}\frac{(r_X + r_Z)}{2}\frac{\varepsilon_{LB}}{A_{1B}}\sin\begin{pmatrix}(\varphi_{NhB} + \zeta_{NhB}) \pm \\ (\varphi_{NhB} + \zeta_{NhB} - \varphi_B - \zeta_{1B})\end{pmatrix} \end{pmatrix} + $$

$$i\begin{pmatrix} \cos(\varphi_{NhB} + \zeta_{NhB}) + \\ \frac{1}{2}\frac{(-r_X + r_Z)}{2}\frac{\varepsilon_{NhA}}{A_{1A}}\sin\begin{pmatrix}(\varphi_{NhB} + \zeta_{NhB}) \pm \\ (\varphi_{NhA} + \zeta_{NhA} - \varphi_A - \zeta_{1A})\end{pmatrix} + \\ \frac{1}{2}\frac{(r_X + r_Z)}{2}\frac{\varepsilon_{NhB}}{A_{1B}}\sin\begin{pmatrix}(\varphi_{NhB} + \zeta_{NhB}) \pm \\ (\varphi_{NhB} + \zeta_{NhB} - \varphi_B - \zeta_{1B})\end{pmatrix} \end{pmatrix}$$

Figure 19:
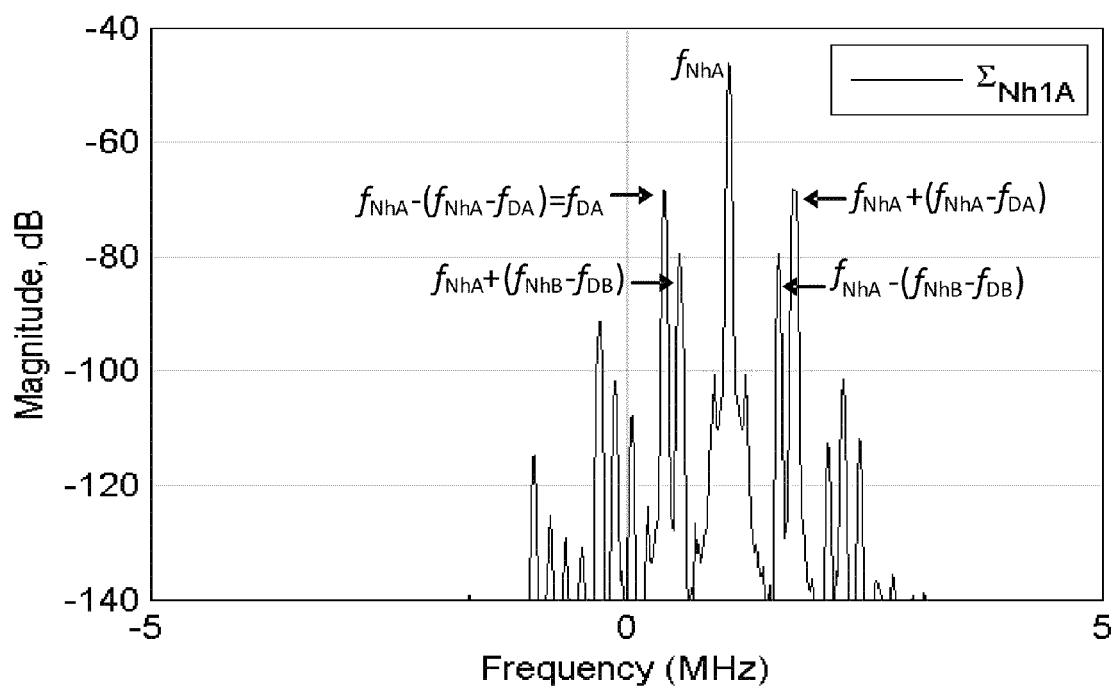
FIG. 19 is a plot of an example of a prototype signal $\Sigma_{Nh1A}$ spectrum.

These signals each have sidebands on both sides at about $\pm(f_{NhA} - f_{DA})$ and about $\pm(f_{NhB} - f_{DB})$, with relative amplitudes predicted by the $$\frac{1}{2}\frac{(\pm k_{NhX} + k_{NhZ})}{2}\frac{\varepsilon_{Nh\_}}{A_{1\_}}$$

terms as shown in the example of FIG. 19 for $\Sigma_{Nh1A}$. Higher order sidebands also exist, as predicted by a more rigorous analysis, but they are lower in amplitude and typically less of a concern. The term sideband is used to refer to the undesired signals that occur at frequencies above or below signals one desires to retain. That is, sideband signals include signals having frequency components on the lower and/or upper side of a desired signal.

The $\Sigma_{Nh1A}$ and $\Sigma_{Nh1B}$ signals can be used to determine the non-harmonic cyclic error component of the DFT signal. However, the desired product of mixing the $f_{NhA}$ component of the $DFT_A$ signal with the dominant $f_{NhA}$ component of the $\Sigma_{Nh1A}$ signal has approximately the same amplitude as the undesired product of mixing the $f_{DA}$ Doppler component of the DFT signal with the lower sideband of the $\Sigma_{Nh1A}$ signal at $f_{NhA} - (f_{NhA} - f_{DA}) = f_{DA}$. A similar condition exists for the upper sideband of the $\Sigma_{Nh1B}$ signal at $f_{NhB} - (f_{NhB} - f_{DB}) = f_{DB}$. At zero or low Z velocities, $f_{NhA} - (f_{NhB} - f_{DB}) \cong f_{DA}$ and $f_{NhB} + (f_{NhA} - f_{DA}) \cong f_{DB}$, causing similar conditions. Therefore, it can be advantageous in certain implementations to eliminate sidebands of the $\Sigma_{Nh1A}$ and $\Sigma_{Nh1B}$ signals.

Sideband Elimination 1

Prototype signals with significantly reduced sidebands may be calculated by including a time-varying magnitude term in the creation of complex prototype signals $\Sigma_{Nh2A}$ and $\Sigma_{Nh2B}$. This approach is similar to the creation of SSB-PM (single-sideband phase modulated) signals (see, e.g., Bedrosian, E.; "The Analytic Signal Representation of Modulated Waveforms," Proc. of the IRE, 1962). The magnitude terms can be derived from the amplitudes of the Doppler signals in equation (48).

Figure 10:
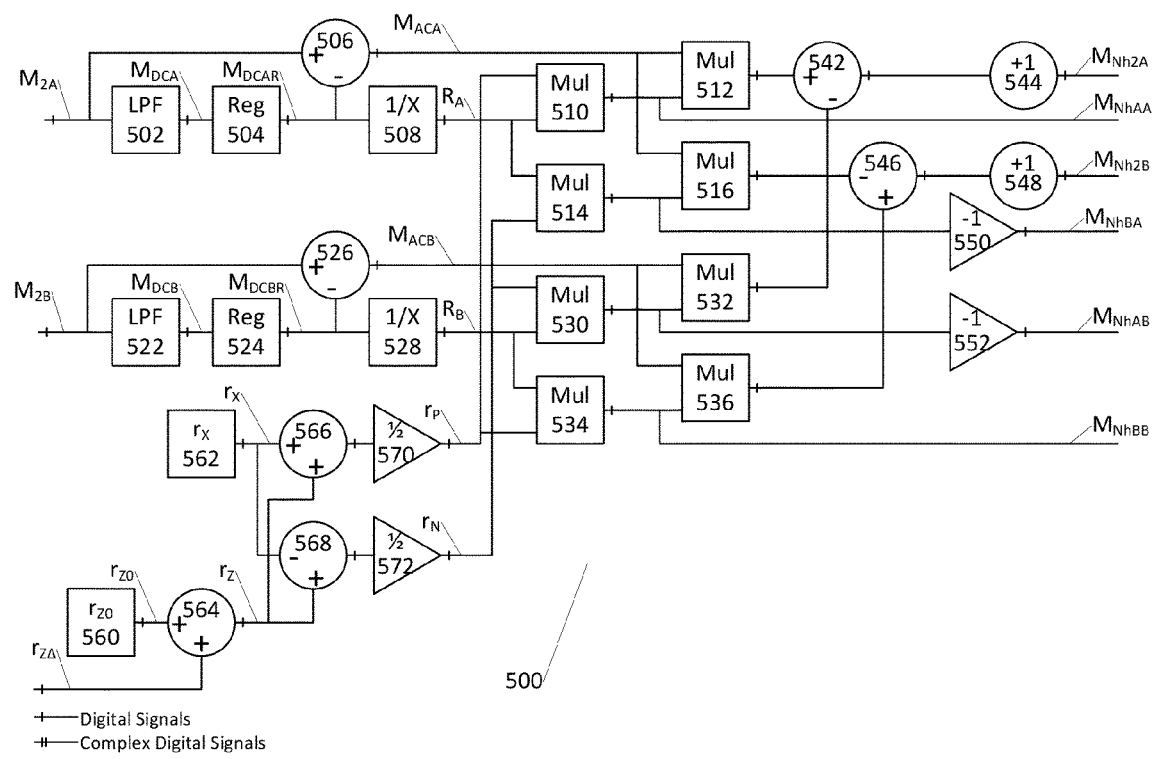
FIG. 10 is a schematic diagram of an example of a magnitude processor.

Time varying magnitude signals $M_{Nh2A}$ and $M_{Nh2B}$ are calculated by magnitude processor 500 as shown in FIG. 10. The average magnitudes (i.e. DC component of the time-varying magnitude) and differences from the average magnitudes (i.e. AC component of the time-varying magnitude) can be calculated by filters 502 and 522 and subtractors 506 and 526 as:

$$M_{DCA} = \text{filter}(M_A)$$

$$M_{DCB} = \text{filter}(M_B) \quad (59)$$

$$M_{ACA} = M_A - M_{DCA}$$

$$M_{ACB} = M_B - M_{DCB} \quad (60)$$

The lowpass filters can include, for example, CIC filters. The order of the filter and the stopband frequency can be chosen based on the frequency range where compensation will be employed, and the suppression of the higher frequencies to obtain the desired measurement accuracy. Registers 504 and 524 allow the control circuitry of the interferometer system to hold the DC values at low frequencies when the LPF would not be effective. Substituting equation (48) gives magnitudes that can be expressed as:

$$M_{DCA} \cong A_{1A}$$

$$M_{DCB} \cong A_{1B} \quad (61)$$

$$M_{ACA} \cong \varepsilon_{NhA} \cos(\phi_{NhA} + \zeta_{NhA} - \phi_A - \zeta_{1A})$$

$$M_{ACB} \cong \varepsilon_{NhB} \cos(\phi_{NhB} + \zeta_{NhB} - \phi_B - \zeta_{1B}) \quad (62)$$

The AC values are scaled the same as the position values in equation (53) and normalized using the DC values; however, the choices of signs are different; the signs determine if the upper or lower sideband is reduced. The sign choices can be made so that the sidebands nearest the corresponding Doppler frequency are reduced, where the non-harmonic cyclic error magnitudes can be expressed as:

$$M_{Nh2A} = 1 + \frac{(r_X + r_Z)}{2}\frac{M_{ACA}}{M_{DCA}} - \frac{(-r_X + r_Z)}{2}\frac{M_{ACB}}{M_{DCB}}$$

$$M_{Nh2B} = 1 - \frac{(-r_X + r_Z)}{2}\frac{M_{ACA}}{M_{DCA}} + \frac{(r_X + r_Z)}{2}\frac{M_{ACB}}{M_{DCB}}. \quad (63)$$

The embodiment of equation (63) is shown in FIG. 10. In some embodiments, a reciprocal and a multiply may be used instead of a divide, and the products containing $M_{ACA}$ or $M_{ACB}$ may be calculated last since the other products may be calculated at a slower rate, e.g., the LPF update rate.

The value of $r_X$ can be constant 562. The nominal value of $r_Z$, $r_{Z0}$ can be constant 560. Depending on the expected uncertainty and variation of $r_Z$, the value of $r_Z$ may be the sum of $r_{Z0}$ and $r_{ZA}$ by adder 564, or it may be a constant. Intermediate values $r_p$ and $r_N$ can be calculated by adders 566 and 568 and constant multipliers 570 and 572. The constant multiplies may be implemented by binary shifts or may be implicitly incorporated into other calculations. The remaining calculations for $M_{Nh2A}$ can be performed by multipliers 510, 512, 530 and 532, and adders 542 and 544. The remaining calculations for $M_{Nh2B}$ can be performed by multipliers 514, 516, 534 and 536 and adders 546 and 548.

Referring again to FIG. 9, the magnitude values $M_{Nh2A}$ and $M_{Nh2B}$, and corresponding position values $P_{NhA}$ and $P_{NhB}$ may be used to create complex prototype signals $\Sigma_{Nh2A}$ and $\Sigma_{Nh2B}$ for characterizing and compensating the non-harmonic cyclic errors, where the complex prototype signals can be expressed as:

$$\Sigma_{Nh2A} = M_{Nh2A}(\sin(P_{NhA}) + i\cos(P_{NhA}))$$

$$\Sigma_{Nh2B} = M_{Nh2B}(\sin(P_{NhB}) + i\cos(P_{NhB})). \tag{64}$$

The component used to obtain the complex prototype signals is shown in FIG. 9 as polar to rectangular converters 414 and 454. This conversion implicitly reduces the position values modulo $2\pi$. The conversion may be done by any appropriate and suitable method. One possible method of conversion is CORDIC conversion. Another faster method includes using a Sine/Cosine lookup table followed by multiplying by the magnitude.

Equations (64) may be expanded by substituting equations (61) (62) and (63), giving, for example:

$$\Sigma_{Nh2A} = \begin{pmatrix} 1 + \frac{(r_X + r_Z)}{2} \frac{\varepsilon_{NhA}}{A_{1A}} \cos(\varphi_{NhA} + \zeta_{NhA} - \varphi_A - \zeta_{1A}) - \\ \frac{(-r_X + r_Z)}{2} \frac{\varepsilon_{NhB}}{A_{1B}} \cos(\varphi_{NhB} + \zeta_{NhB} - \varphi_B - \zeta_{1B}) \end{pmatrix} \tag{65}$$

$$(\sin P_{NhA} + i\cos P_{NhA})$$

$$\Sigma_{Nh2B} = \begin{pmatrix} 1 - \frac{(-r_X + r_Z)}{2} \frac{\varepsilon_{NhA}}{A_{1A}} \cos(\varphi_{NhA} + \zeta_{NhA} - \varphi_A - \zeta_{1A}) + \\ \frac{(r_X + r_Z)}{2} \frac{\varepsilon_{NhB}}{A_{1B}} \cos(\varphi_{NhB} + \zeta_{NhB} - \varphi_B - \zeta_{1B}) \end{pmatrix}$$

$$(\sin P_{NhB} + i\cos P_{NhB})$$

Figure 20:
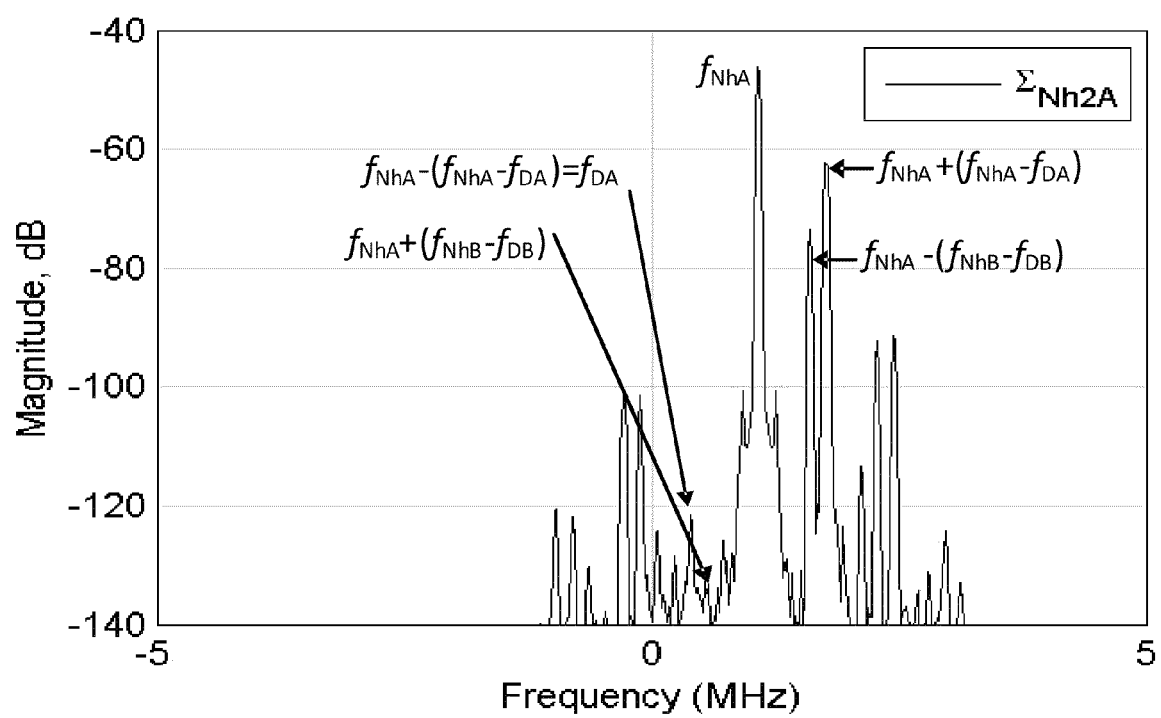
FIG. 20 is a plot of an example of a prototype signal $\Sigma_{Nh2A}$ spectrum.

These complex prototype signals each have two sidebands on the side near the Doppler signal that are substantially reduced or eliminated, and two sidebands on the other side that are increased by approximately 2×(6 dB). In this example, as shown in FIG. 20 for $\Sigma_{Nh2A}$, the undesired sidebands are reduced by approximately 54 dB.

Sideband Elimination 2

The remaining sidebands on $\Sigma_{Nh2A}$ and $\Sigma_{Nh2B}$ significantly limit the achievable cyclic error compensation. A second stage of compensation can be applied to eliminate the two largest sidebands on each of $\Sigma_{Nh2A}$ and $\Sigma_{Nh2B}$. For example, referring to FIG. 12 and FIG. 13, compensating signals $\Sigma_{\psi Nh3A}$ and $\Sigma_{\psi Nh3B}$ are created and deducted from $\Sigma_{Nh2A}$ and $\Sigma_{Nh2B}$ respectively to create $\Sigma_{Nh3A}$ and $\Sigma_{Nh3B}$.

The frequencies of the four largest sidebands on $\Sigma_{Nh2A}$ and $\Sigma_{Nh2B}$ can be expressed as $$f_{NhAA} = f_{NhA} + (f_{NhA} - f_{DA})$$

$$f_{NhAB} = f_{NhA} - (f_{NhB} - f_{DB})$$

$$f_{NhBA} = f_{NhB} - (f_{NhA} - f_{DA})$$

$$f_{NhBB} = f_{NhB} + (f_{NhB} - f_{DB}), \tag{66}$$

the phases of these signals can be expressed as $$\phi_{NhAA} = (P_{NhA} + (P_{NhA} - P_{DA})) \bmod 2\pi$$

$$\phi_{NhAB} = (P_{NhA} - (P_{NhB} - P_{DB})) \bmod 2\pi$$

$$\phi_{NhBA} = (P_{NhB} - (P_{NhA} - P_{DA})) \bmod 2\pi$$

$$\phi_{NhBB} = (P_{NhB} + (P_{NhB} - P_{DB})) \bmod 2\pi, \tag{67}$$

and calculated by adders 420, 424, 428, 460, 464, and 468 as shown in FIG. 9.

The magnitudes of these signals can be expressed as $$M_{NhAA} = \frac{(r_X + r_Z)}{2} \frac{1}{M_{DCA}} \tag{68}$$

$$M_{NhBA} = \frac{(-r_X + r_Z)}{2} \frac{1}{M_{DCA}}$$

$$M_{NhAB} = \frac{(-r_X + r_Z)}{2} \frac{1}{M_{DCB}}$$

$$M_{NhBB} = \frac{(r_X + r_Z)}{2} \frac{1}{M_{DCB}}$$

and can be calculated by magnitude processor 500, which can calculate them from the terms of equation (63) that were previously calculated, as shown in FIG. 10. The two additional negations may be provided by 550 and 552, or may be incorporated in other calculations with appropriate sign changes The four prototype sideband compensation signals can be expressed as $$\Sigma_{NhAA} = M_{NhAA}(\sin \phi_{NhAA} + i\cos \phi_{NhAA})$$

$$\Sigma_{NhBA} = M_{NhBA}(\sin \phi_{NhBA} + i\cos \phi_{NhBA})$$

$$\Sigma_{NhAB} = M_{NhAB}(\sin \phi_{NhAB} + i\cos \phi_{NhAB})$$

$$\Sigma_{NhBB} = M_{NhBB}(\sin \phi_{NhBB} + i\cos \phi_{NhBB}) \tag{69}$$

and, referring to FIG. 9, are calculated, for example, by polar-to-rectangular converters 426, 470, 430 and 466. The conversion may be done by any suitable and appropriate method. One approach is to use CORDIC conversion. Another faster approach is to use a Sine/Cosine lookup table followed by multiplying by the magnitude.

The sideband compensation signals can be expressed as $$\Sigma_{\psi Nh2A} = \Sigma_{NhAA}(C_{NhRA}^*) + \Sigma_{NhAB} C_{NhRB} \tag{70}$$

and $$\Sigma_{\psi Nh2B} = \Sigma_{NhBB}(C_{NhRB}^*) + \Sigma_{NhBA} C_{NhRA} \tag{71}$$

The compensated complex prototype signals can be expressed as $$\Sigma_{NhA} = \Sigma_{Nh2A} - \Sigma_{\psi Nh2A} \tag{72}$$

and $$\Sigma_{NhB} = \Sigma_{Nh2B} - \Sigma_{\psi Nh2B} \tag{73}$$

Figure 12:
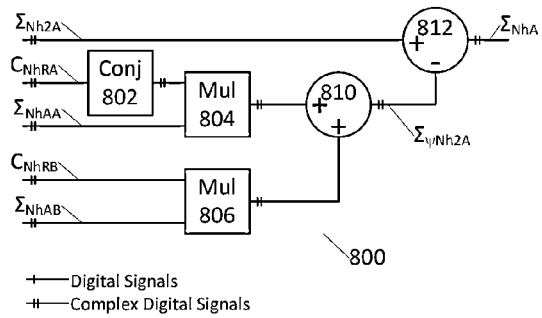
FIG. 12 is a schematic diagram of an example of a sideband compensator.
Figure 13:
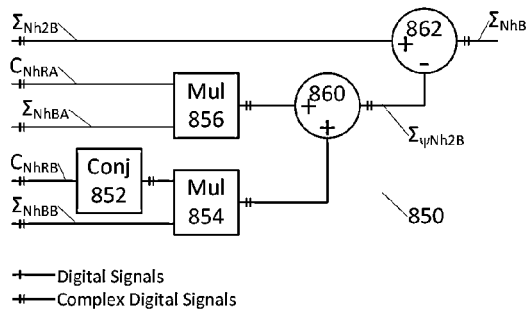
FIG. 13 is a schematic diagram of an example of a sideband compensator.

Referring to FIG. 9, compensated complex prototype signals $\Sigma_{NhA}$ and $\Sigma_{NhB}$ are calculated, for example, by sideband compensators 800 and 850 respectively. Referring to FIG. 12, equation (70) is calculated, for example, by complex conjugate 802, multipliers 804 and 806, and adder 810. Equation (72) is calculated, for example, by adder 812. Equation (70) is calculated, for example, by complex conjugate 802, multipliers 804 and 806, and adder 810. Equation (72) is calculated, for example, by adder 812.

In some embodiments, the magnitudes and phases of the sideband compensation signals can be calculated in the same manner as the cyclic error compensation. However, that method of calculation uses Z velocity for initialization and may fail to work when the sidebands merge at zero Z velocity.

Figure 21:
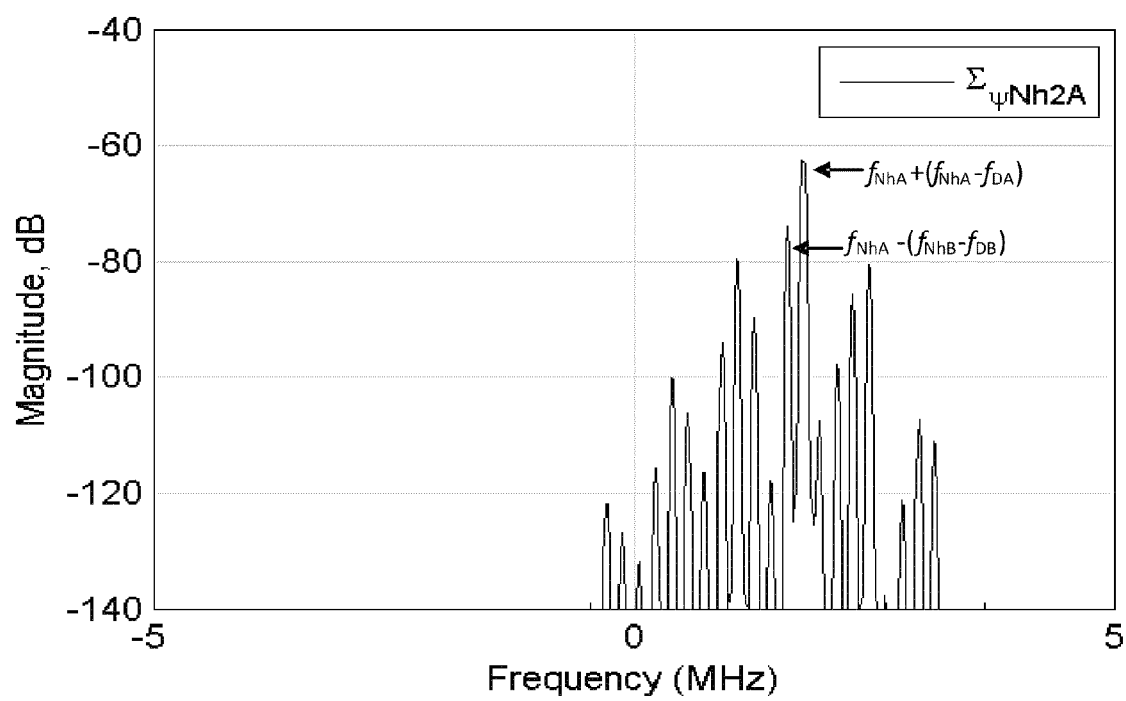
FIG. 21 is a plot of an example of a prototype signal $\Sigma_{\psi Nh2A}$ spectrum.
Figure 22:
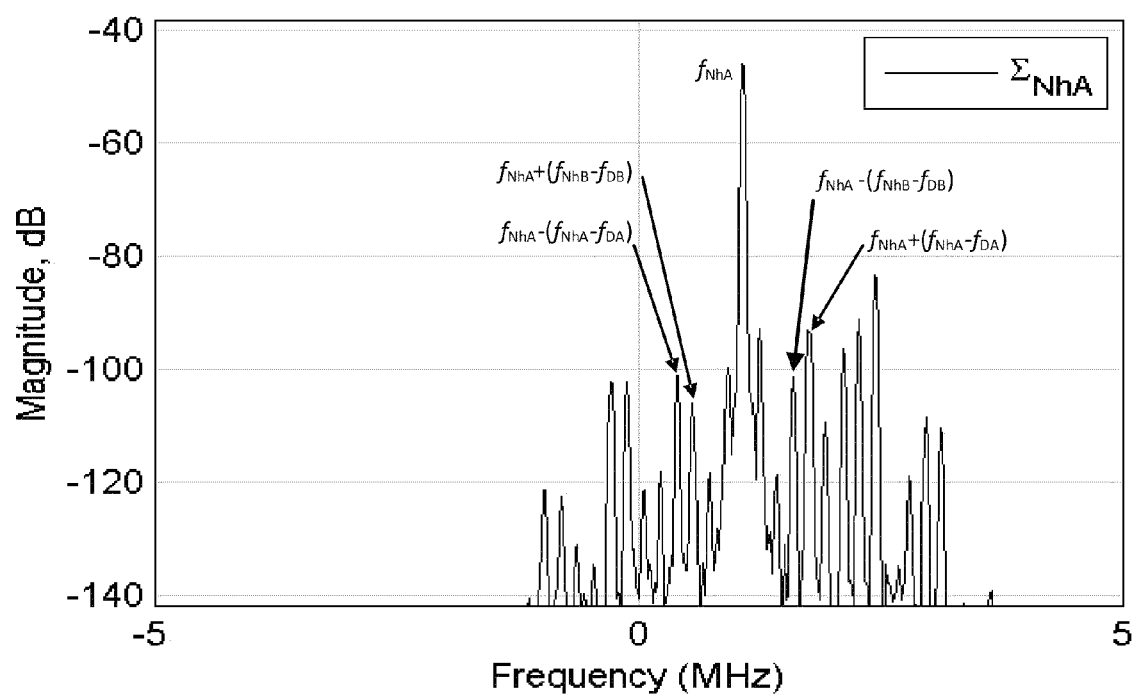
FIG. 22 is a plot of an example of a prototype signal $\Sigma_{NhA}$ spectrum.

Examples of signals $\Sigma_{\psi Nh2A}$ and $\Sigma_{NhA}$ are shown in FIG. 21 and FIG. 22, respectively. In this example, the largest (i.e., greatest peak amplitude) sideband in $\Sigma_{NhA}$ shown in FIG. 22 is approximately 21 dB lower than the largest sideband in $\Sigma_{Nh2A}$, shown in FIG. 20. The peak of $\Sigma_{NhA}$ is approximately 0.2 dB (2%) larger than the peak of $\Sigma_{Nh2A}$ due to coincidence of the peak of $\Sigma_{Nh2A}$ with a sideband of $\Sigma_{\psi Nh2A}$.

It might be suspected that the same sideband-altering approach as described earlier for the calculation of $\Sigma_{Nh2A}$ and $\Sigma_{Nh2B}$ would be beneficial for the $\Sigma_{\psi Nh2A}$ signal and the $\Sigma_{\psi Nh2B}$ signal. However, that approach is generally not beneficial here, because the cancellation does not provide a significant benefit; instead, the 6 dB increase in the level of the sidebands on the opposite side can adversely affect the end result, leading to a need for additional calculation.

Compensation

Figure 23:
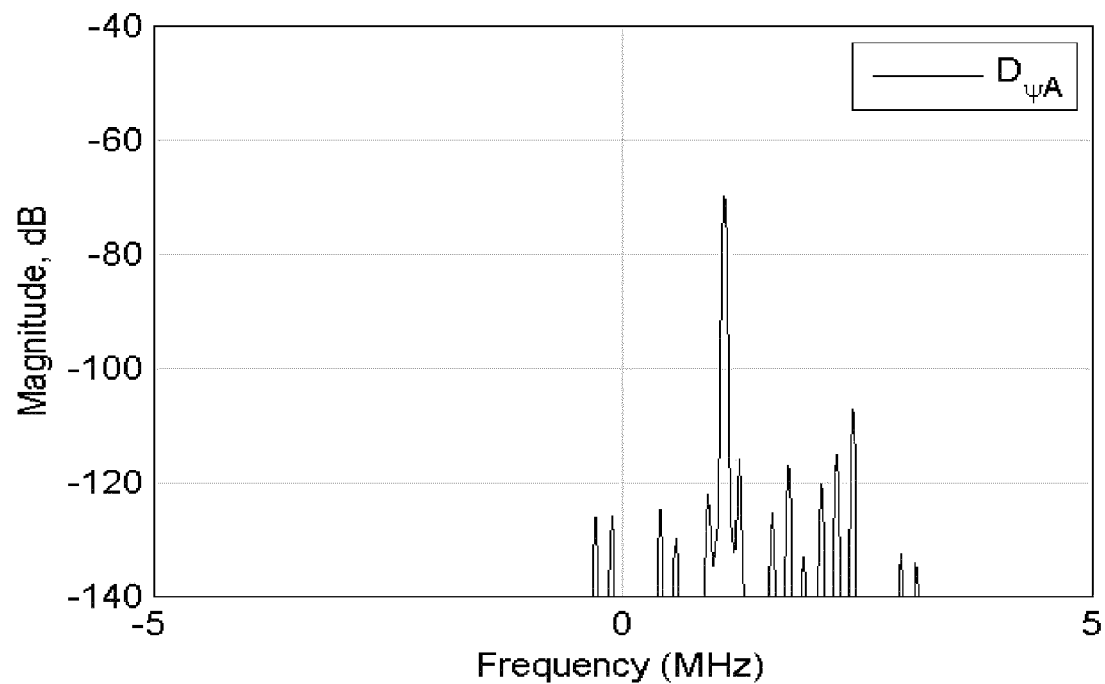
FIG. 23 is a plot of an example of an error compensation signal $D_{\psi A}$ spectrum
Figure 24:
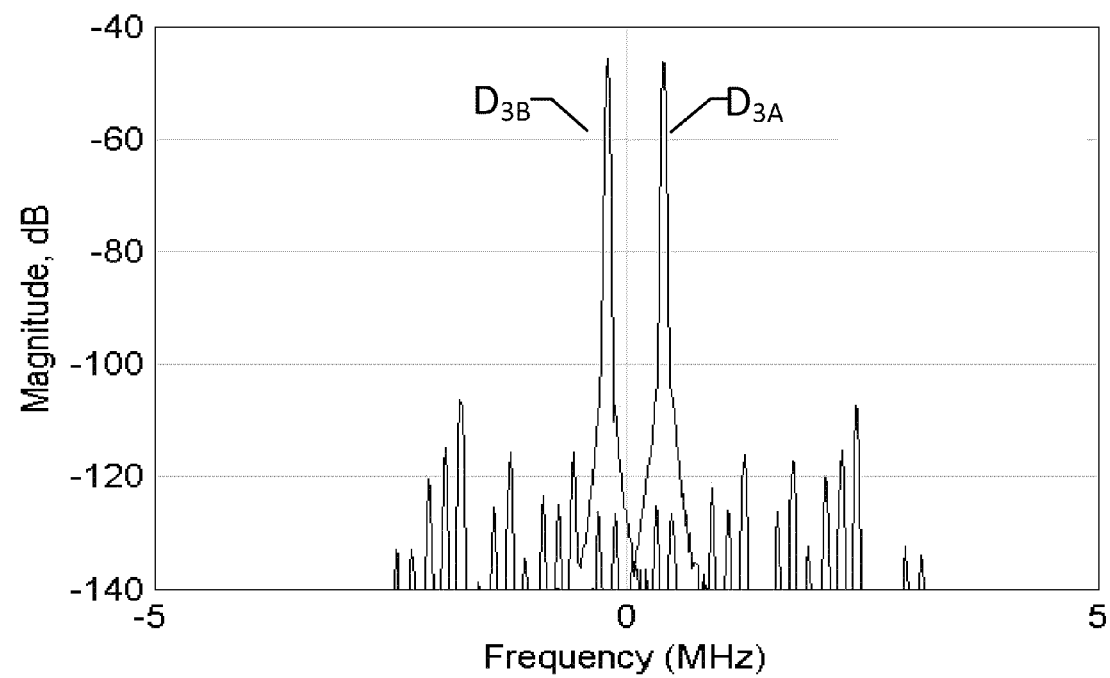
FIG. 24 is a plot of an example of a spectrum for compensated signals $D_{3A}$ and $D_{3B}$.

Referring to FIG. 7, the $\Sigma_{NhA}$ and $\Sigma_{NhB}$ signals from CE Ad calculator 400 are provided to their corresponding error estimators 700 and 702 as previously described. The error estimators calculate the complex error compensation signals $D_{\psi A}$ 165 and $D_{\psi B}$ 265 as previously described. An example of compensation signal $D_{\psi A}$ 165 is shown in FIG. 23. The compensations signals $D_{\psi A}$ 165 and $D_{\psi B}$ 265 are combined with the corresponding measurement signals $D_A$ and $D_B$ to produce compensated measurement signals $D_{3A}$ 169 and $D_{3B}$ 269 as previously described. An example of compensated signals $D_{3A}$ 169 and $D_{3B}$ 269 is shown in FIG. 24. In this example, a cyclic error reduction of approximately 37 dB (70×) has been demonstrated.

$r_Z$ Adjustment

The calculated offset phases $\zeta_{NhA}$ and $\zeta_{NhB}$ will typically be constant with Z motion if the value of $r_Z$ used in these calculations is correct. In some embodiments, complex values $C_{NhRA}$ and $C_{NhRB}$, which are directly related to $\zeta_{NhA}$ and $\zeta_{NhB}$, are used to adjust $r_Z$ to minimize the phase variation of $C_{NhRA}$ and $C_{NhRB}$ with Z motion. This is required for proper compensation at low or zero X velocity when there may be Z motion.

The $r_Z$ adjuster 600 is shown in FIG. 9 within CE Ad compensation 400. Adder 480 calculates the Z velocity $2V_Z$ for the control circuitry of the interferometer system and for operation of the $r_Z$ adjuster. The $r_Z$ adjuster determines adjustment value $r_{Z\Delta}$ that is combined with a typical nominal or assumed value of $r_Z$.

Figure 11:
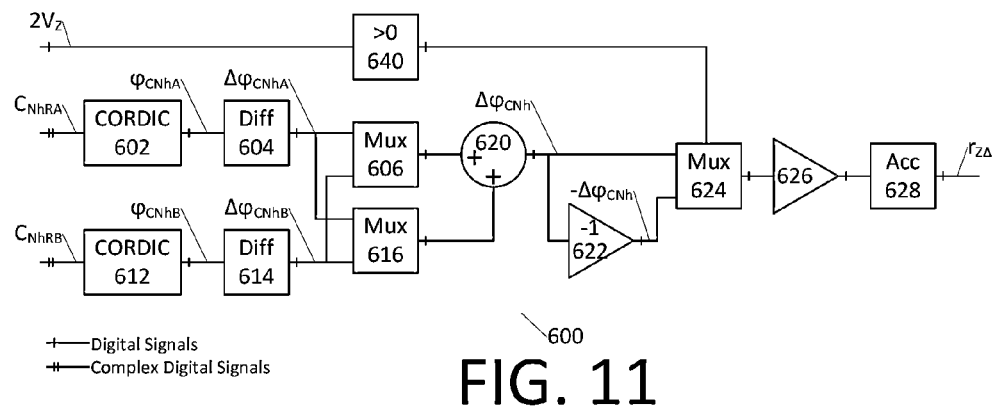
FIG. 11 is a schematic diagram of an example of a cyclic error ratio adjuster.

Referring to the example shown in FIG. 11, complex values $C_{NhRA}$ and $C_{NhRB}$ are converted to phase values $\phi_{CNhA}$ and $\phi_{CNhB}$ by CORDIC converters 602 and 612. These CORDIC converters can be a variation of CORDIC converters described elsewhere in this disclosure, or other equivalent implementations, since they have a slower update rate and do not need a magnitude output. Differentiators 604 and 614 calculate $$\frac{d\varphi_{CNh}}{dt}$$

for $\phi_{CNhA}$ and $\phi_{CNhB}$ as $\Delta\phi_{CNhA}$ and $\Delta\phi_{CNhB}$. Adder 620 and muxes 606 and 616 can have control circuitry that selects the mode of operation as shown in equation (74), depending on whether the A and B velocities are less than the threshold below which compensation calculations are not effective. This selection maintains constant loop gain when either A or B channel is not suitable for use in the $r_{Z\Delta}$ adjustment.

$|V_A|>V_{Min}$ $|V_B|>V_{Min}$ $\Delta\phi_{CNh}=\Delta\phi_{CNhA}+\Delta\phi_{CNhB}$ $|V_A|>V_{Min}$ $|V_B|\leq V_{Min}$ $\Delta\phi_{CNh}=\Delta\phi_{CNhA}+\Delta\phi_{CNhA}$ $|V_A|\leq V_{Min}$ $|V_B|>V_{Min}$ $\Delta\phi_{CNh}=\Delta\phi_{CNhB}+\Delta\phi_{CNhB}$ $|V_A|\leq V_{Min}$ $|V_B|\leq V_{Min}$ $\Delta\phi_{CNh}=0$ \hfill (74)

Comparator 640, negator 622, and mux 624 are arranged, for example, with control circuitry to negate $\Delta\phi_{CNh}$ when the Z velocity is positive, and set $\Delta\phi_{CNh}=0$ when the Z velocity is near zero.

Constant multiplier 626 and accumulator 628 complete the feedback loop that adjusts $r_{Z\Delta}$ to the optimum value. The optimum value of constant multiplier 626 may be determined empirically or analytically to obtain good response time without ringing or overshoot. The range of accumulator 628 can be limited to slightly wider than the expected adjustment range. Limiting the accumulator range in this manner can advantageously improve settling time and avoid problems due to unusual startup conditions.

Differentiators 604 and 614 may be simple difference calculators that include one or more delay registers and a subtractor, or they may be a more sophisticated differentiator using a FIR filter or other structure. Accumulator 628 may be a simple accumulator that include an adder and a register, or it may be a more sophisticated integrator using a FIR filter or other structure. The integrator and differentiator may be chosen to operate in with respect to Z position, rather than time. To reduce high frequency noise, a CIC lowpass filter or other filtering method may be inserted in the $r_Z$ adjustment path.

The calculation of $\Delta\phi_{CNh}$ and the controls may have various implementations including, for example: (1) implementations in which a constant or otherwise adjustable value of $r_Z$ is used; (2) implementations in which the averaging done by adder 620 is eliminated, using only one of $C_{LRA}$ or $C_{LRB}$; and (3) implementations in which a second constant or adjustable value is used with a second multiplier to provide independent $P_{LZ}$ values to adders 412 and 452 in FIG. 9.

Continuous Multiplier

In embodiments where the multiplier value of multiplier 300 in FIG. 9 may vary during operation, additional consideration is required. For example, the value of $P_Z$ may be in the millimeter range, and the desired phase accuracy of $\phi_{NhZ}$ may be in the nanometer range. Thus, a multiplier change greater than 1 part per million can produce a significant phase change. In some embodiments, multiplier 300 is a continuous multiplier, designed to prevent instantaneous changes to the output value when the multiplier value is changed. Referring to the example of FIG. 14, a continuous multiplier example of multiplier 300 is shown. Multiplier 310 multiplies input value $P_Z$ by a constant value representing a typical or expected value of $r_Z$, producing partial product $P_{NhZ1}$. Differentiator 302, multiplier 304 and integrator 306 provide a variable gain of $r_{Z\Delta}$ with no discontinuities, producing partial product $P_{NhZ2}$. The partial products $P_{NhZ1}$ and $P_{NhZ2}$ are combined by adder 320. Differentiator 302 may be a simple difference calculation that includes one or more delay registers and a subtractor, or it may be a more sophisticated differentiator using a FIR filter or other structure. Integrator 306 may be a simple accumulator that includes an adder and a register, or it may be a more sophisticated integrator using a FIR filter or other structure. The operation of the continuous multiplier may be expressed as:

$$P_{LZ} = P_{EZ}k_{LZ1} + \int k_{LZ2}\frac{dP_{EZ}}{dt}dt \qquad (75)$$

$$= P_{EZ}(k_{LZ1} + k_{LZ2})$$

CE Nh Processing (1 axis)

Figure 15:
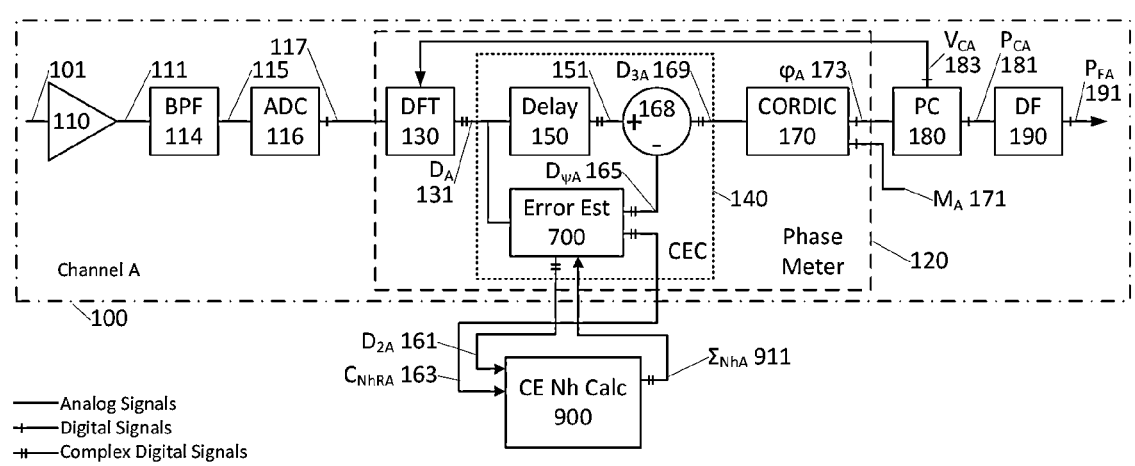
FIG. 15 is a schematic diagram of an example of a cyclic error compensation signal processing system.

Referring to FIG. 15, a schematic diagram of an example of CE Nh signal processing for a single measurement axis is shown. Processor 100 is substantially the same as processor 100 shown in FIG. 7. CE Nh Calculator 900 is a simplified version of CE Ad processor 400 shown in FIG. 7 and detailed in FIG. 8.

Figure 16:
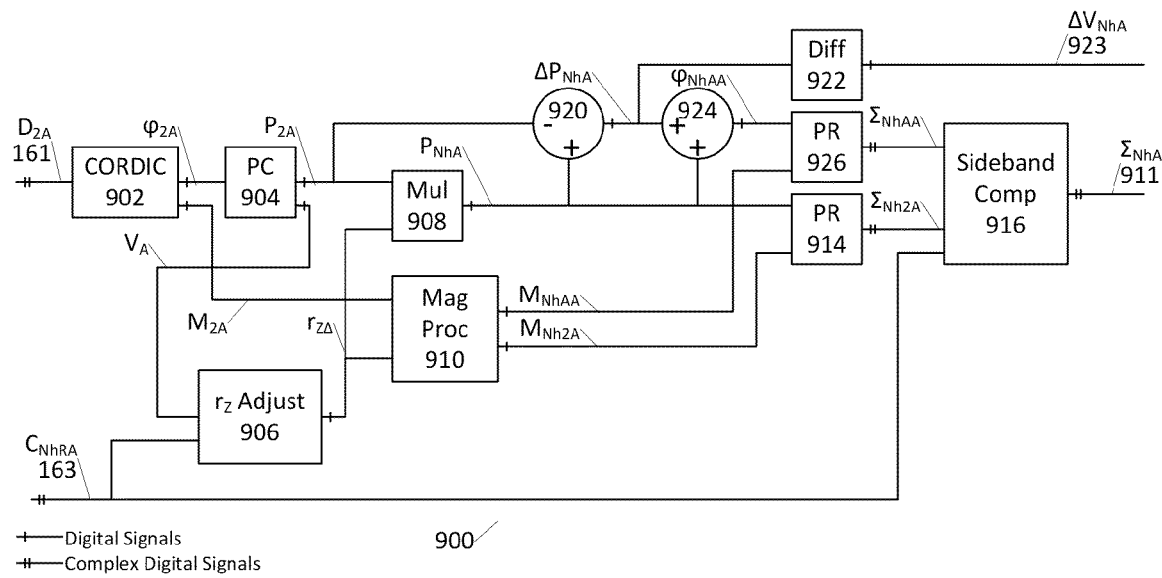
FIG. 16 is a schematic diagram of an example of a non-harmonic cyclic error calculator.

FIG. 16 is a schematic diagram of an example of a CE Nh Calculator 900. Functions related to the second axis have been eliminated, greatly simplifying the processing. CORDIC converter 902 converts the DFT signal $D_{2A}$ to magnitude $M_{2A}$ and phase $\phi_{2A}$. Position calculator 904 unwraps or connects the phase values to provide position values $P_{2A}$. Complex prototype signal $\Sigma_{Nh2}$ is calculated, for example, by polar-to-rectangular converter 914 using time-varying magnitude signal $M_{Nh2A}$ from magnitude processor 910 and position values $P_{2A}$ from multiplier 908. Complex sideband compensation signal $\Sigma_{NhAA}$ is calculated, for example, by polar-to-rectangular converter 926 using magnitude signal $M_{NhAA}$ from magnitude processor 910 and phase $\phi_{NhAA}$ from adders 920 and 924. Sideband compensator 916 uses compensation signal $\Sigma_{NhA}$ and coefficients $C_{NhRA}$ to substantially reduce the sideband on signal $\Sigma_{Nh2}$, producing output $\Sigma_{NhA}$ 911 for error estimator 700 shown in FIG. 15.

The cyclic error compensation techniques described above are not limited to the specified mathematical operations or order of operations. That is, other mathematically equivalent operations, which are capable of producing the same or similar results, also can be used. This can include rearranging and/or adding or removing multiply operations and/or conjugate operations. For example, instead of performing a multiply operation between two separate inputs followed by a conjugate operation, a conjugate operation may be performed on each input, followed by a multiply operation between the conjugated inputs. In some implementations, such rearrangement can advantageously reduce hardware requirements.

The cyclic error compensation techniques described above can be applied to any suitable interferometric encoder system in which non-harmonic cyclic errors and/or axis-dependent errors occur.

Depending on the embodiment, the compensation technique described above can be implemented using control electronics in an interferometer system, in which the control electronics are implemented through hardware or software, or a combination of both. The techniques can be implemented in computer programs using standard programming techniques following the method and figures described herein. Program code is applied to input data to perform the functions described herein and generate output information. The output information (e.g., position information related to a relative position of a target object to the optical assembly) is applied to one or more output devices such as a servo control system or display device.

Each program may be implemented in a high level procedural or object oriented programming language to communicate with a computer system, or the programs can be implemented in assembly or machine language, if desired. In any case, the language can be a compiled or interpreted language. Moreover, the program can run on dedicated integrated circuits preprogrammed for that purpose.

Each such computer program may be stored on a storage medium or device (e.g., ROM, magnetic diskette, FLASH drive, among others) readable by a general or special purpose programmable computer, for configuring and operating the computer when the storage media or device is read by the computer to perform the procedures described herein. The computer program can also reside in cache or main memory during program execution. The compensation technique can also be implemented as a computer-readable storage medium, configured with a computer program, where the storage medium so configured causes a computer to operate in a specific and predefined manner to perform the functions described herein.

Lithography Systems

Because of the cyclic error compensation, the interferometry systems described herein provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 22 nm line widths (design rules), see, for example, the International Technology Roadmap for Semiconductors, pp. 58-59 (2009).

Overlay depends directly on the performance, i.e., accuracy and precision, of the displacement measuring interferometers and interferometric encoder systems used to position the wafer and reticle (or mask) stages. Since a lithography tool may produce $50-100M/year of product, the economic value from improved performance displacement measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photochemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems can be increased and/or maintained over longer periods of time without offline maintenance as cyclic error contributions to the distance measurement are minimized, resulting in higher throughput due to increased yields and less tool downtime.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometric encoder systems described above can be used to precisely measure the positions of each of the wafer stage and mask stage relative to other components of the exposure system, such as the lens assembly, radiation source, or support structure. In such cases, the interferometry system can be attached to a stationary structure and the measurement object having the encoder scale attached to a movable element such as one of the mask and wafer stages. Alternatively, the situation can be reversed, with the interferometry system attached to a movable object and the measurement object having the encoder scale attached to a stationary object.

More generally, such interferometry systems can be used to measure the position of any one component of the exposure system relative to any other component of the exposure system, in which the interferometry system is attached to, or supported by, one of the components and the measurement object having the encoder scale is attached, or is supported by the other of the components.

Figure 25:
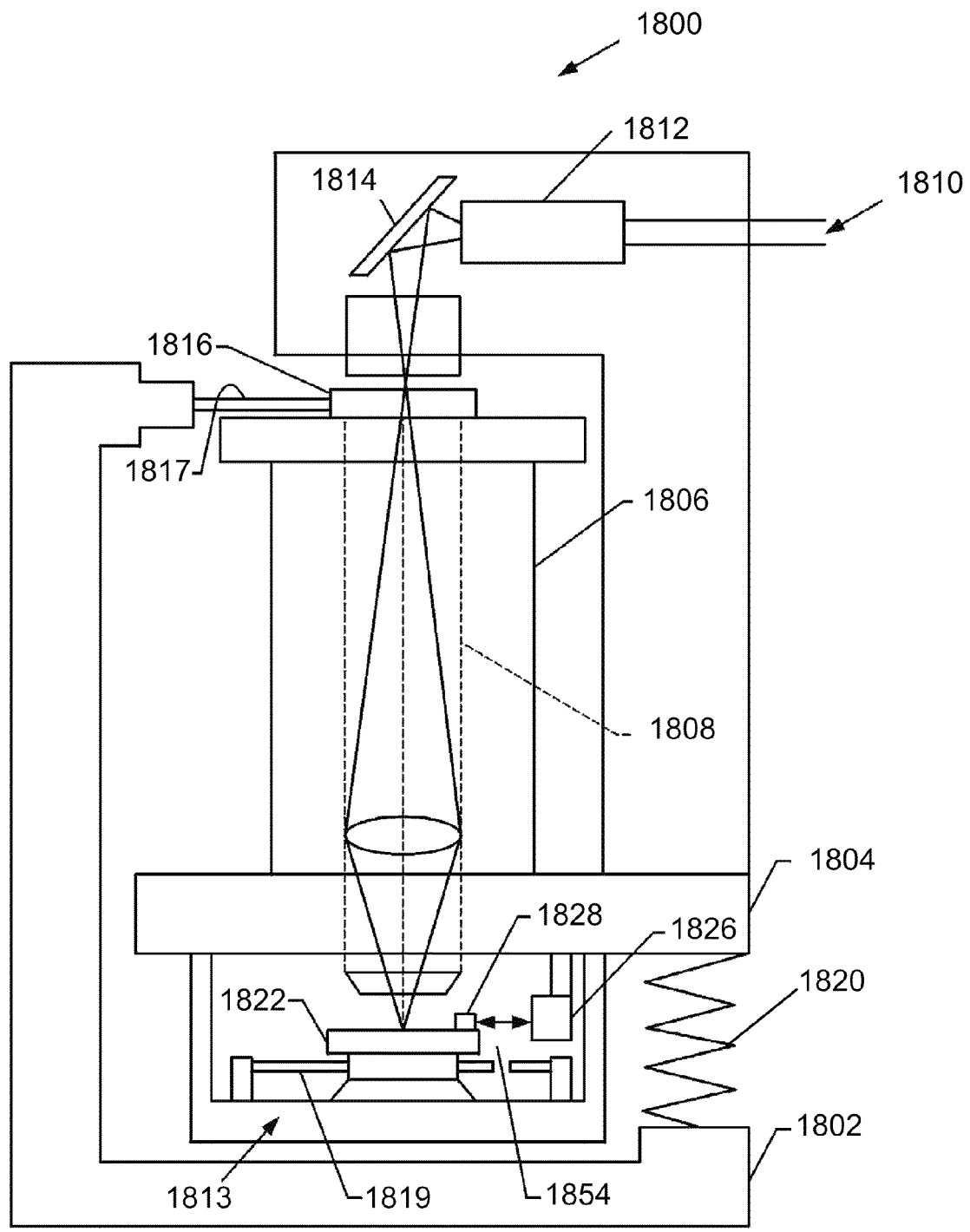
FIG. 25 is a schematic diagram of an example of a lithography tool that includes an interferometer.

An example of a lithography tool 1800 using an interferometry system 1826 is shown in FIG. 25. The encoder system is used to precisely measure the position of a wafer (not shown) within an exposure system. Here, stage 1822 is used to position and support the wafer relative to an exposure station. Scanner 1800 includes a frame 1802, which carries other support structures and various components carried on those structures. An exposure base 1804 has mounted on top of it a lens housing 1806 atop of which is mounted a reticle or mask stage 1816, which is used to support a reticle or mask. A positioning system for positioning the mask relative to the exposure station is indicated schematically by element 1817. Positioning system 1817 can include, e.g., piezoelectric transducer elements and corresponding control electronics. Although, it is not included in this described embodiment, one or more of the encoder systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1804 is a support base 1813 that carries wafer stage 1822. Stage 1822 includes a measurement object 1828 for diffracting a primary beam 1854 directed to the stage by optical assembly 1826. A positioning system for positioning stage 1822 relative to optical assembly 1826 is indicated schematically by element 1819. Positioning system 1819 can include, e.g., piezoelectric transducer elements and corresponding control electronics. The primary beam is incident on encoder scale at an incident angle such that the diffracted measurement beam does not satisfy the Littrow condition. Of course, erroneous beams that satisfy the Littrow condition may occur. One or more optical elements (not shown) then can be used to direct the diffracted measurement beam back to the interferometry system, which is mounted on exposure base 1804. The interferometry system can be any of the embodiments described previously.

During operation, a radiation beam 1810, e.g., an ultraviolet (UV) beam from a UV laser (not shown), passes through a beam shaping optics assembly 1812 and travels downward after reflecting from mirror 1814. Thereafter, the radiation beam passes through a mask (not shown) carried by mask stage 1816. The mask (not shown) is imaged onto a wafer (not shown) on wafer stage 1822 via a lens assembly 1808 carried in a lens housing 1806. Base 1804 and the various components supported by it are isolated from environmental vibrations by a damping system depicted by spring 1820.

In some embodiments, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the interferometry system 1826 can include what is known in the art as a column reference. In such embodiments, the interferometry system 1826 derives a reference beam (not shown) from the primary beam. In some embodiments, the reference beam is derived from a source separate from the primary beam. One or more optical components (not shown) within the interferometry system 1826 combine the reference beam with the diffracted measurement beam to produce an output beam. The interference signal produced by interferometry system 1826 when combining diffracted measurement beam 1854 diffracted from encoder scale 1828 and the reference beam indicates changes in the position of the stage relative to the radiation beam. Furthermore, in other embodiments the interferometry system 1826 can be positioned to measure changes in the position of reticle (or mask) stage 1816 or other movable components of the scanner system. Finally, the interferometry systems can be used in a similar fashion with lithography systems involving steppers, in addition to, or rather than, scanners.

Figure 26A:
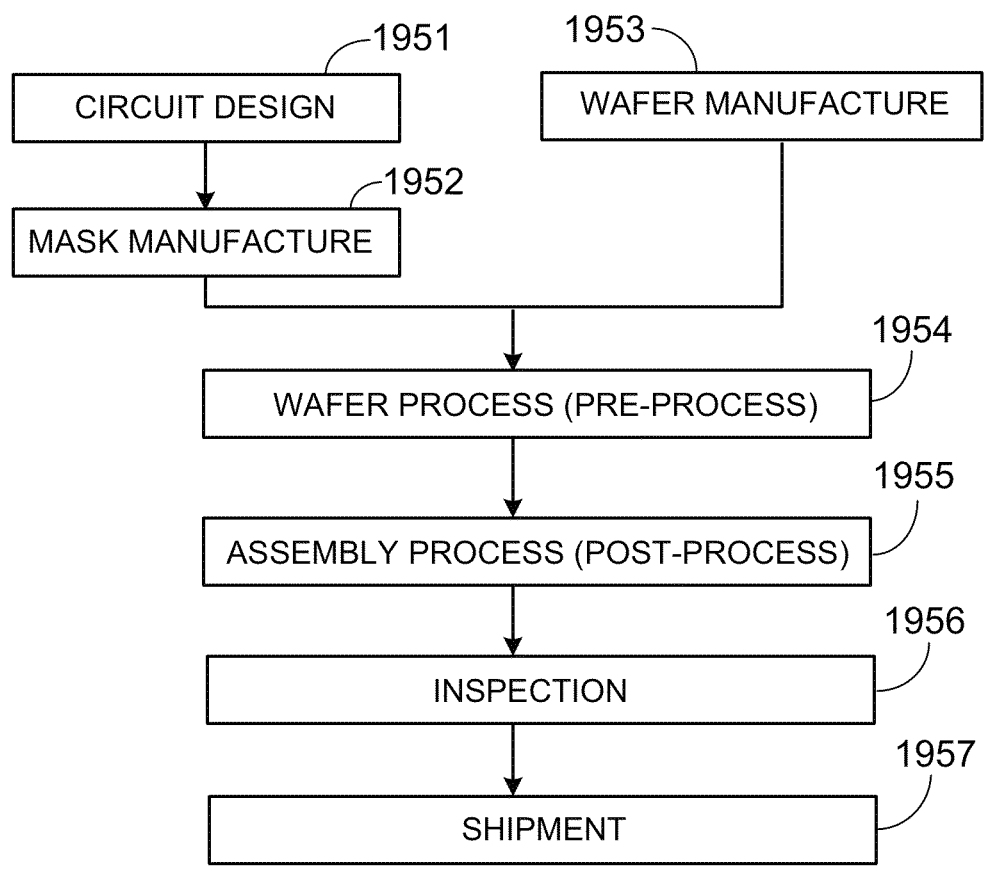
FIG. 26A and FIG. 26B are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 26A and 26B. FIG. 26A is a flow chart of the sequence of manufacturing a semiconductor device such as a semiconductor chip (e.g., IC or LSI), a liquid crystal panel or a CCD. Step 1951 is a design process for designing the circuit of a semiconductor device. Step 1952 is a process for manufacturing a mask on the basis of the circuit pattern design. Step 1953 is a process for manufacturing a wafer by using a material such as silicon.

Step 1954 is a wafer process that is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1955 is an assembling step, which is called a post-process wherein the wafer processed by step 1954 is formed into semiconductor chips. This step includes assembling (dicing and bonding) and packaging (chip sealing). Step 1956 is an inspection step wherein operability check, durability check and so on of the semiconductor devices produced by step 1955 are carried out. With these processes, semiconductor devices are finished and they are shipped (step 1957).

Figure 26B:
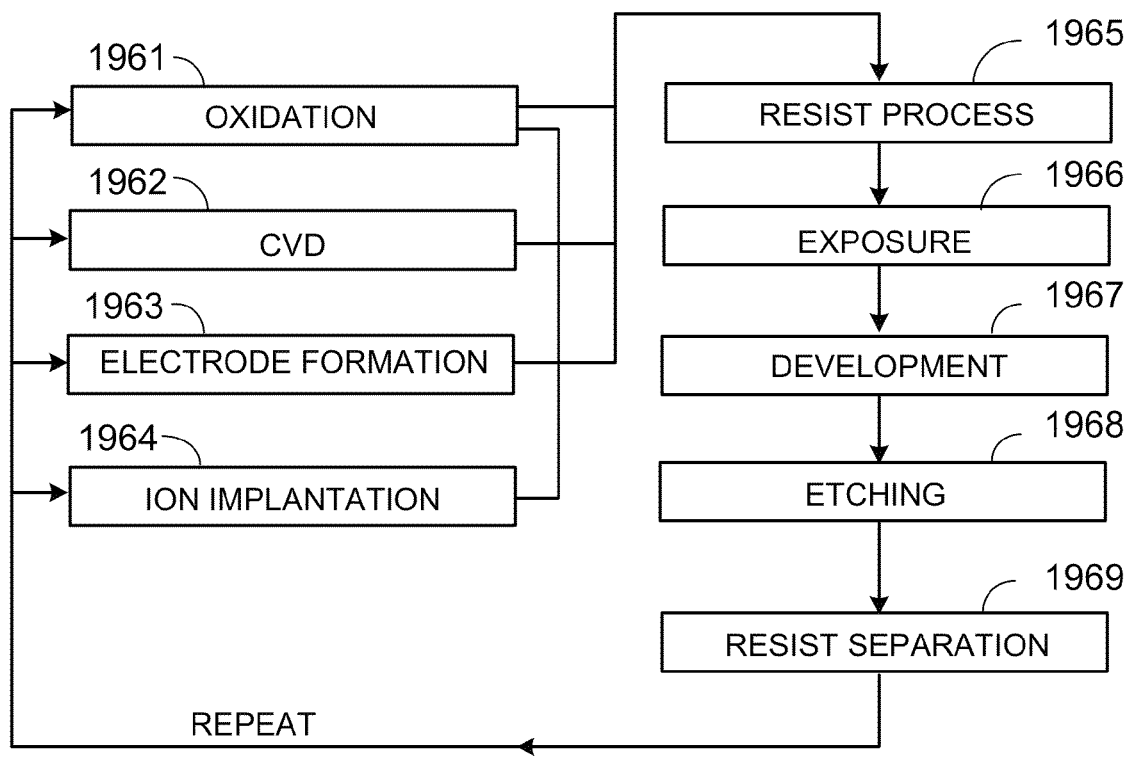

FIG. 26B is a flow chart showing details of the wafer process. Step 1961 is an oxidation process for oxidizing the surface of a wafer. Step 1962 is a CVD process for forming an insulating film on the wafer surface. Step 1963 is an electrode forming process for forming electrodes on the wafer by vapor deposition. Step 1964 is an ion implanting process for implanting ions to the wafer. Step 1965 is a resist process for applying a resist (photosensitive material) to the wafer. Step 1966 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1967 is a developing process for developing the exposed wafer. Step 1968 is an etching process for removing portions other than the developed resist image. Step 1969 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 27:
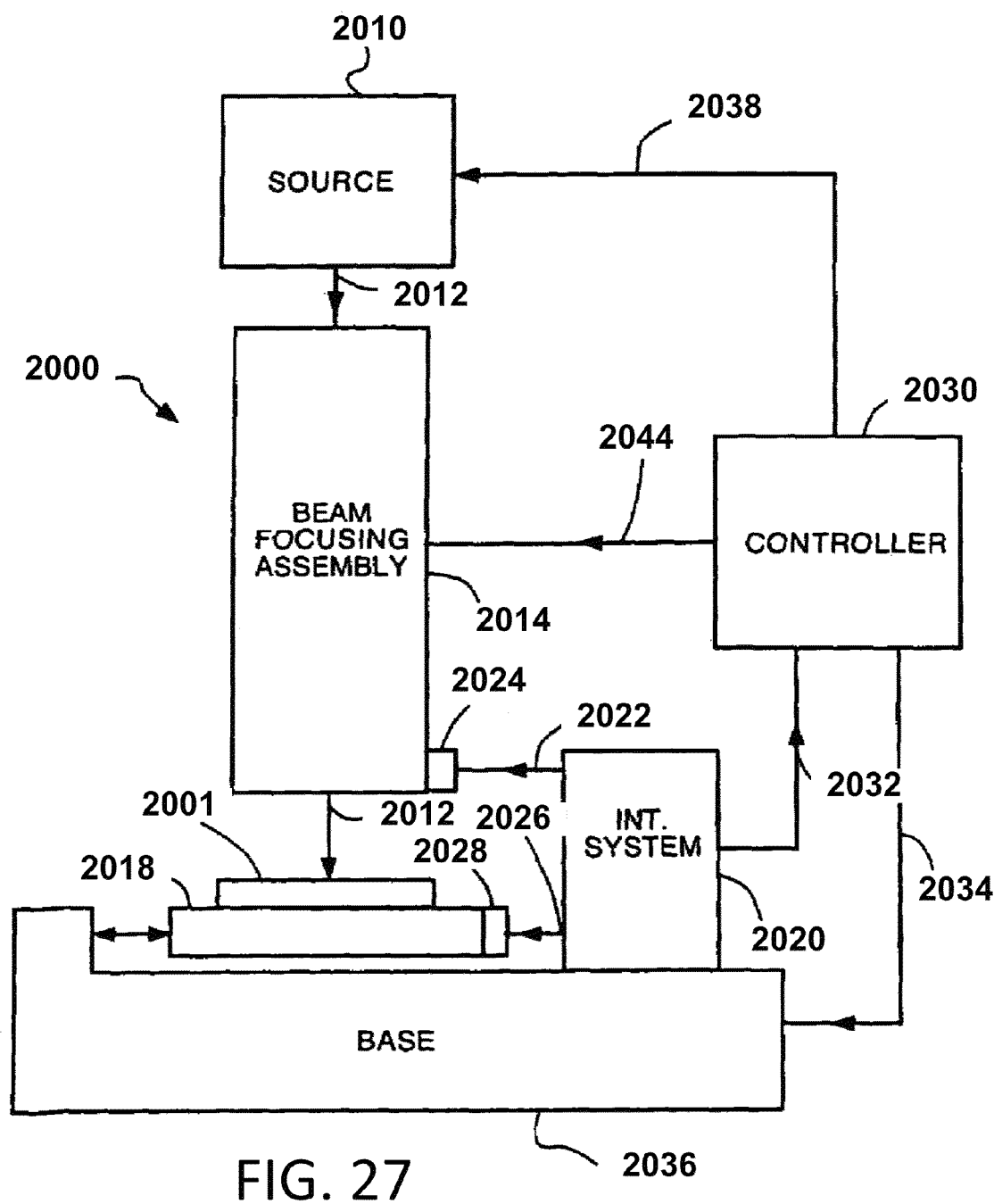
FIG. 27 is a schematic of an example of a beam writing system that includes an interferometry system.

As an example, a schematic of a beam writing system 2000 is shown in FIG. 27. A source 2010 generates a radiation beam 2012 ("write beam"), and a beam focusing assembly 2014 directs the write beam 2012 to a substrate 2001 supported by a movable stage 2018. To determine the relative position of the stage, an interferometry system 2020 directs a reference beam 2022 to a mirror or encoder scale 2024 mounted on beam focusing assembly 2014 and a measurement beam 2026 to a mirror or encoder scale 2028 mounted on stage 2018. Since the reference beam contacts a mirror or encoder scale mounted on the beam focusing assembly, the beam writing system is an example of a system that uses a column reference. Interferometry system 2020 can be any of the interferometry systems described previously. Changes in the position measured by the interferometry system correspond to changes in the relative position of write beam 2012 on substrate 2001. Interferometry system 2020 sends a measurement signal 2032 to controller 2030 that is indicative of the relative position of write beam 2012 on substrate 2001. Controller 2030 sends an output signal 2034 to a base 2036 that supports and positions stage 2018. In addition, controller 2030 sends a signal 2038 to source 2010 to vary the intensity of, or block, write beam 2012 so that the write beam contacts the substrate with an intensity sufficient to cause photophysical or photochemical change only at selected positions of the substrate.

Furthermore, in some embodiments, controller 2030 can cause beam focusing assembly 2014 to scan the write beam over a region of the substrate, e.g., using signal 2044. As a result, controller 2030 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention.

For example, in some embodiments, the cyclic error compensation techniques described herein could be performed using digitized measurement signal (DMS) processing at the ADC digital sampling rate. Further details on how to perform DMS are described, for example, in U.S. Pat. Nos. 6,950,192 and 7,428,685. In some embodiments, the cyclic error compensation techniques described herein could be combined with low velocity cyclic error compensation, as described, for example, in U.S. Pat. No. 7,616,322.

In some embodiments, the order in which the CE 0, CE N, CE B, CE Nh, and CE Ad compensation are performed can be modified. For example, in some implementations, error compensation can be performed in serial fashion with CE 0 compensation first, CE Nh compensation second and then either CE N or CE B compensation. Either CE N or CE B compensation could then be performed last. In some implementations, CE 0 compensation is performed first followed by CE N and CE Nh compensation performed in parallel. Alternatively, CE0 compensation is followed by CE B and CE Nh compensation in parallel with one another. The order of compensation may be determined based on the relative cyclic error amplitudes of each error.

In some embodiments, a digital filter can be used to reduce the sidebands of the compensation signal.

Other embodiments are within the scope of the following claims.

What is claimed is:

1. A method comprising:
    obtaining, from a detector of an interferometry system, an interference signal based on a combination of a first beam and a reference beam, subsequent to the first beam being diffracted from an encoder scale;
    obtaining, through an electronic processor, an error compensation signal based on a non-harmonic cyclic error that modifies the interference signal; and
    outputting information about a change in a position of the encoder scale relative to an optical assembly of the interferometry system based on the interference signal and the error compensation signal.

2. The method of claim 1, wherein the non-harmonic cyclic error causes a frequency shift in the interference signal equal to a non-integer multiple of a Doppler frequency.

3. The method of claim 2, further comprising:
providing an input beam; and
deriving the first beam from the input beam in the optical assembly of the interferometer system, wherein the Doppler frequency corresponds to a shift in frequency difference between the first beam and the reference beam caused by motion of the encoder scale.

4. The method of claim 1, further comprising:
applying a frequency transform to the interference signal to generate a transformed measurement signal in complex space; and
modifying the transformed measurement signal based on the error compensation signal to obtain a compensated measurement signal having an attenuated non-harmonic cyclic error, wherein the error compensation signal is a signal in complex space.

5. The method of claim 4, wherein modifying the transformed measurement signal comprises deducting the error compensation signal from the transformed measurement signal.

6. The method of claim 4, wherein obtaining the error compensation signal comprises compensating the transformed measurement signal based on at least one of a negative Doppler shift error, a baseband Doppler shift error, or a zero Doppler shift error to provide a partially compensated measurement signal.

7. The method of claim 6, wherein obtaining the error compensation signal further comprises:
calculating a complex prototype signal based on the partially compensated measurement signal, wherein the complex prototype signal represents a frequency of the non-harmonic cyclic error signal associated with the interference signal.

8. The method of claim 7, wherein obtaining the error compensation signal further comprises:
delaying the partially compensated measurement signal;
obtaining a conjugate of the partially compensated measurement signal; and
multiplying the complex prototype signal and the conjugate of the partially compensated measurement signal to obtain an output signal, wherein the output signal corresponds to a frequency difference between the partially compensated measurement signal and the complex prototype signal.

9. The method of claim 8, wherein obtaining the error compensation signal further comprises:
passing the output signal through a lowpass filter to obtain a non-harmonic cyclic error coefficient term, wherein the non-harmonic cyclic error coefficient term comprises a complex factor relating to an amplitude and an offset phase of the non-harmonic cyclic error;
multiplying a conjugate of the of the non-harmonic cyclic error coefficient term with the complex prototype signal to obtain a non-harmonic correction signal; and
adding the non-harmonic cyclic error correction signal to one or more other correction signals to provide the cyclic error compensation signal.

10. The method of claim 9, further comprising storing the non-harmonic cyclic error coefficient term in a register.

11. The method of claim 7, wherein calculating the complex prototype signal comprises:
calculating a time-varying phase of the non-harmonic cyclic error;
calculating an initial complex prototype signal based on the time-varying phase of the non-harmonic cyclic error, wherein the initial complex prototype signal is representative of the frequency of the non-harmonic cyclic error signal;
calculating a magnitude compensation signal based on a magnitude of the partially compensated measurement signal;
calculating a partially attenuated prototype signal by multiplying the magnitude compensation signal and the initial complex prototype signal; and
selectively attenuating the partially attenuated prototype signal to obtain the complex prototype signal.

12. The method of claim 11, wherein the time-varying phase of the non-harmonic cyclic error is based on a ratio of a non-harmonic cyclic error frequency shift to a Doppler frequency.

13. The method of claim 12, further comprising adjusting the ratio based at least in part on one or more non-harmonic cyclic error compensation coefficients.

14. The method of claim 11, wherein calculating the partially attenuated prototype signal comprises attenuating a signal component of the initial prototype signal at a frequency equal to the Doppler frequency.

15. The method of claim 11, wherein selectively attenuating the partially attenuated prototype signal comprises attenuating a signal component of the partially attenuated prototype signal at a frequency defined by a difference between the Doppler frequency and the frequency of the non-harmonic cyclic error signal.

16. The method of claim 11, wherein selectively attenuating the partially attenuated prototype signal comprises:
calculating one or more sideband compensation signals; and
deducting the one or more sideband compensation signals from the partially attenuated prototype signal.

17. The method of claim 16, wherein calculating the one or more sideband compensation signals is based in part on a non-harmonic cyclic error coefficient term.

18. The method of claim 17, further comprising storing the non-harmonic cyclic error coefficient term in a register.

19. The method of claim 17, further comprising storing the non-harmonic cyclic error coefficient term when a speed of the encoder scale relative to the optical assembly along a first direction is below a specified threshold.

20. The method of claim 4, further comprising calculating at least one of a position of the encoder scale along a first direction or a motion of the encoder scale along the first direction based on the compensated measurement signal.

21. The method of claim 1, wherein the first beam is twice diffracted from the encoder scale.

22. The method of claim 1, wherein the first beam and the second beam are derived from a common source.

23. The method of claim 1, wherein the encoder scale comprises a grating.

24. The method of claim 23, wherein the grating comprises a one-dimensional grating or a two-dimensional grating.

25. An apparatus comprising:
an interferometry system configured to, during operation of the apparatus, combine a measurement beam diffracted from an encoder scale and a reference beam to produce an output beam corresponding to an interference signal,
wherein at least one of the encoder scale and an optical assembly of the interferometry system is moveable with respect to the other; and an electronic processor configured to, during operation of the apparatus, perform operations comprising:
obtaining the interference signal from a detector of the interferometry system;
obtaining an error compensation signal based on a non-harmonic cyclic error that modifies the interference signal; and
outputting information about a change in a position of the encoder scale relative to the optical assembly based on the interference signal and the error compensation signal.

26. The apparatus of claim 25, wherein the electronic processor is configured to perform operations further comprising:
applying a frequency transform to the interference signal to generate a transformed measurement signal in complex space; and
modifying the transformed measurement signal based on the error compensation signal to obtain a compensated measurement signal having an attenuated non-harmonic cyclic error, wherein the error compensation signal is a signal in complex space.

27. The apparatus of claim 26, wherein modifying the transformed measurement signal comprises deducting the error compensation signal from the transformed measurement signal.

28. The apparatus of claim 26, wherein obtaining the error compensation signal comprises compensating the transformed measurement signal based on at least one of a negative Doppler shift error, a baseband Doppler shift error or a zero Doppler shift error to provide a partially compensated measurement signal.

29. The apparatus of claim 27, wherein the electronic processor is configured to perform operations further comprising calculating a complex prototype signal based on the partially compensated measurement signal, the complex prototype signal representing a frequency of the non-harmonic cyclic error associated with the interference signal.

30. The apparatus of claim 26, wherein the electronic processor is configured to perform operations further comprising calculating at least one of a position of the encoder scale or a motion of the encoder scale from the compensated measurement signal.

31. A computer program product, encoded on a non-transitory computer-readable medium, operable to cause a data processing apparatus to perform operations comprising:
obtaining, from a detector of an interferometer, an interference signal based on a combination of a measurement beam and a reference beam, subsequent to the measurement beam being diffracted from an encoder scale;
obtaining an error compensation signal based on a non-harmonic cyclic error that modifies the interference signal; and
outputting information about a change in a position of the encoder scale relative to the optical assembly based on the interference signal and the error compensation signal.

32. A lithography system comprising:
a moveable stage for supporting a wafer, wherein the moveable stage includes an encoder scale that moves with the moveable stage;
an illumination system configured to image radiation onto the wafer during operation of the lithography system;
a positioning system configured to adjust a position of the moveable stage during operation of the lithography system;
an interferometry system configured to, during operation of the lithography system:
direct a measurement beam toward the encoder scale;
combine the measurement beam and a reference beam, subsequent to the measurement beam being diffracted by the encoder scale, to produce an output beam corresponding to a first interference signal; and
detect the interference signal at a detector; and
an electronic processor configured to, during operation of the lithography system, perform operations comprising:
obtaining the interference signal from the detector;
obtaining an error compensation signal based on a non-harmonic cyclic error associated with the interference signal; and
outputting information about a change in a position of the encoder scale relative to an optical assembly of the interferometry system based on the interference signal and the error compensation signal.

* * * * *

UNITED STATES PATENT AND TRADEMARK OFFICE
CERTIFICATE OF CORRECTION

| | | |
|---|---|---|
| PATENT NO. | : 9,146,093 B2 | Page 1 of 1 |
| APPLICATION NO. | : 13/672021 | |
| DATED | : September 29, 2015 | |
| INVENTOR(S) | : Frank C. Demarest | |

It is certified that error appears in the above-identified patent and that said Letters Patent is hereby corrected as shown below:

In the claims,

Column 41

Line 56, delete "of the of the" and insert -- of the --

Column 43

Line 33 (Approx.), in Claim 29, delete "claim 27," and insert -- claim 28, --

Signed and Sealed this
Twenty-eighth Day of June, 2016

Michelle K. Lee
*Director of the United States Patent and Trademark Office*